(12) United States Patent
Nagata

(10) Patent No.: US 7,332,916 B2
(45) Date of Patent: Feb. 19, 2008

(54) ON-CHIP SIGNAL WAVEFORM MEASUREMENT APPARATUS FOR MEASURING SIGNAL WAVEFORMS AT DETECTION POINTS ON IC CHIP

(75) Inventor: Makoto Nagata, Kobe (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 11/366,835

(22) Filed: Mar. 3, 2006

(65) Prior Publication Data
US 2006/0197697 A1    Sep. 7, 2006

(30) Foreign Application Priority Data
Mar. 3, 2005    (JP)    ............................. 2005-059282

(51) Int. Cl.
*G01R 27/08* (2006.01)
*G01R 27/02* (2006.01)
*G01R 31/26* (2006.01)

(52) U.S. Cl. ..................... 324/713; 324/76.12; 324/765
(58) Field of Classification Search ..................... None
See application file for complete search history.

(56) References Cited

U.S. PATENT DOCUMENTS

| 4,799,165 | A * | 1/1989 | Hollister et al. ............... 702/66 |
| 6,483,287 | B2 * | 11/2002 | Otsubo et al. ............ 324/76.39 |
| 6,922,066 | B2 | 7/2005 | Hidaka |
| 2004/0104740 | A1 * | 6/2004 | Burns et al. ................ 324/763 |
| 2006/0020412 | A1 * | 1/2006 | Bruensteiner ............... 702/117 |

FOREIGN PATENT DOCUMENTS

| JP | 10-123215 A | 5/1998 |
| JP | 2001-77160 A | 3/2001 |
| JP | 2003-28898 A | 1/2003 |

OTHER PUBLICATIONS

Nagata et al, "Effects of Power-Supply Parasitic Components on Substrate Noise Generation in Large-Scale Digital Circuits", 2001 Symposium on VLSI Circuits Digest of Technical Papers, No. 15-1, Kyoto in Japan, Jun. 2001, pp. 159-162.
Noguchi et al, "On-Chip Power Source/Ground Measurement Technique", Proceedings on the Seventh System LSI Workshop, Non-regular Technical Committee of the IEICE (Inst. of Electronics, Information and Communication Engineers) on ICD (Integrated Circuits and Devices), Nov. 2003, pp. 287-290 and partial English translation.

* cited by examiner

*Primary Examiner*—Anjan Deb
*Assistant Examiner*—Jeff Natalini
(74) *Attorney, Agent, or Firm*—Nixon & Vanderhye, P.C.

(57) ABSTRACT

An on-chip signal waveform measurement apparatus mounted on an IC chip measures signal waveforms at detection points on the IC chip. A reference voltage generator successively generates reference voltages different from each other based on a predetermined timing signal, and Signal probing front-end circuits are mounted to correspond to the detection points, respectively, and each buffer-amplifies a voltage at each detection point, compares the buffer-amplified voltage with each reference voltage, and digitizes a comparison result into a binary digital output signal. A multiplexer time-division-multiplexes the binary digital output signals from the signal probing front-end circuits. A data processing unit calculates a judgment output probability for a detected voltage at each detection point detected by the respective signal probing front-end circuits, by counting a number of times of a predetermined binary value of the multiplexed binary digital output signal.

18 Claims, 31 Drawing Sheets

MULTI-CHANNEL SUCCESSIVE APPROXIMATION TYPE
AD CONVERTER APPARATUS

N CHANNEL SOURCE FOLLOWER CIRCUIT 111

P CHANNEL SOURCE FOLLOWER CIRCUIT 112

LATCH COMPARATOR 34

REFERENCE VOLTAGE GENERATOR 10

Fig. 15 REPLICA DLL CIRCUIT 21

Fig. 23

SIGNAL WAVEFORM MEASUREMENT SYSTEM

OFF-CHIP DPU 214

Fig. 32 SIGNAL PROBING FRONT-END CIRCUIT 30B

ON-CHIP SIGNAL WAVEFORM MEASUREMENT APPARATUS FOR MEASURING SIGNAL WAVEFORMS AT DETECTION POINTS ON IC CHIP

BACKGROUND OF THE INVENTION

1. Field of the Invention

The present invention relates to an on-ship signal waveform measurement apparatus for, on multi-channels, measuring signal waveforms at detection points on fixed voltage wiring lines such as internal signals, power source voltages, ground voltages, well voltages, and substrate voltages of a semiconductor large-scale integrated circuit (LSI), and a signal waveform measuring system including the on-ship signal waveform measurement apparatus. The present invention further relates to a sampling timing signal generator for use in the signal waveform measurement system.

2. Description of the Related Art

With an increased degree of micro-fabrication in the semiconductor wafer fabrication process, the scale of the circuits mounted on LSI chips becomes larger. In recent years, a mixed signal system LSI in which different types of signal processing functions such as an analog processing and a digital processing or a high frequency radio communication processing and a baseband data processing are integrated on a single chip has been commonly employed. However, since such an LSI is configured so that many functional circuits are integrated on the LSI chip, the operation states of respective functional circuits cannot be observed from an outside of the chip. As a result, it is difficult to perform a fault analysis in a case of an operation fault. On the other hand, considerations of noise generated in a power source, a ground, a well, and a substrate have been increasingly important in a high-rate and low power consumption LSI, and then, the need for on-chip measurement and evaluation of such noise on the LSI chip has been growing. These background arts are disclosed in the following patent documents 1-3 and non-patent documents 1-2.

(a) Patent Document 1: Japanese patent laid-open publication No. JP-10-123215-A;

(b) Patent Document 2: Japanese patent laid-open publication No. JP-2001-077160-A;

(c) Patent Document 3: Japanese Patent laid-open publication No. JP-2003-028898-A;

(d) Non-Patent Document 1: Makoto Nagata et al., "Effects of Power-Supply Parasitic Components on Substrate Noise Generation in Large-Scale Digital Circuits", 2001 Symposium on VLSI Circuits Digest of Technical Papers, #15-1, Kyoto in Japan, pp. 159-162, June 2001; and (e) Non-Patent Document 2: Koichiro Noguchi et al., "On-Chip Power Source/Ground Measurement Technique", Proceedings of the Seventh System LSI Workshop, Non-regular Technical Committee of The IEICE (Institute of Electronics, Information and Communication Engineers) on ICD (Integrated Circuits and Devices), pp. 287-290, November 2003.

In order to meet the above need, it is effective to mount a function that measures an internal signal on the LSI chip. Conventionally, there has been known a technique capable of measuring a noise distribution on the LSI chip by arraying a probing front-end (FE) circuit constituted by a source follower (SF) circuit and a latch comparator (LC) (See the Non-Patent Document 1). However, this technique has the following problems. If only the probing front-end circuit is mounted on an LSI chip, the number of pins required for measurement becomes larger, and the performance required by an external measurement unit becomes higher, then this leads to increase in the manufacturing cost. In order to solve the problems, there was proposed an on-chip configuration in which not only the probing front-end circuit but also a timing signal generation circuit and a reference voltage generation mechanism are integrated on an IC chip (See the Non-Patent Document 2).

However, this technique still has the following problems. It is still necessary to reduce the measurement time, to reduce the chip area, and to ensure a higher measurement precision in multi-channel configuration. Therefore, the measurement system functions insufficiently as means for, on multi-channels, measuring various kinds of waveforms such as the internal signal and noises of the power source voltage, the ground voltage, the well voltage, and the substrate voltage of the LSI.

SUMMARY OF THE INVENTION

A signal waveform measurement apparatus and a signal waveform measurement system are provided, capable of acquiring waveforms at multiple observation points on an LSI chip such as internal signals and noises of various voltages of functional circuits that constitute a system LSI, at higher rate with higher precision than those of prior art.

A sampling timing signal generator for a signal waveform measurement system is also provided. The sampling timing signal generator has an operation noise smaller than that of prior art and is suitable for an on-chip signal waveform measurement apparatus.

In order to achieve the aforementioned objective, according to one aspect of the present technology, there is provided an on-chip signal waveform measurement apparatus mounted on an IC chip. The on-chip signal waveform measurement apparatus measures signal waveforms at a plurality of detection points on the IC chip, and includes a reference voltage generator, a plurality of signal probing front-end circuits, a multiplexer, and a data processing unit. The reference voltage generator successively generates and outputs a plurality of reference voltages different from each other based on a predetermined timing signal. The signal probing front-end circuits are mounted so as to correspond to the detection points, respectively. Each of the signal probing front-end circuits buffer-amplifies a voltage at each of the detection points, compares the buffer-amplified voltage with each of the reference voltages, digitizes a comparison result into a binary digital output signal, and outputs the binary digital output signal. The multiplexer time-division-multiplexes the binary digital output signals from the signal probing front-end circuits, and outputs a multiplexed digital output signal. The data processing unit calculates and outputs a judgment output probability for a detected voltage at each of the detection points detected by each of the signal probing front-end circuits, by counting a number of times of a predetermined binary value (such as 1 or 0) of the multiplexed binary digital output signal outputted from the multiplexer.

The above-mentioned on-chip signal waveform measurement apparatus preferably further includes a sampling timing signal generator, and a demultiplexer. The sampling timing signal generator generates an enable timing control signal obtained by multiplexing the plurality of enable timing signals based on a predetermined system clock and a predetermined master clock. The demultiplexer demultiplexes the enable timing control signal to generate and output the enable timing signals for allowing the respective signal probing front-end circuits to sequentially operate. The sampling timing signal generator preferably includes a replica DLL (Delayed Locked Loop) circuit, and a delay signal generator circuit. The replica DLL circuit generates and outputs a predetermined reference bias voltage in synchronization with the system clock signal based on the system clock signal. The delay signal generator circuit generates a current obtained by dividing a reference current corresponding to the reference bias voltage by the number "n" (where "n" is a number equal to or larger than one) based on the master clock signal and the reference bias voltage, generates a predetermined delay time by multiplying a time for electrically charging an output load capacitance by the number "n" based on the generated current, and delays the master clock signal by the delay time, to generate the enable timing control signal obtained by multiplexing the plurality of enable timing signals. In this case, the replica DLL circuit generates the reference bias voltage so that the delay time is equal to a cycle of the system clock signal, and this leads to that the delay signal generator circuit generates the enable timing control signal obtained by multiplexing the plurality of enable timing signals.

In the above-mentioned on-chip signal waveform measurement apparatus, each of the signal probing front-end circuit preferably includes a source follower circuit, and a comparator. The source follower circuit buffer-amplifies the voltage at each of the detection points based on each of the enable timing signals, and the comparator compares the buffer-amplified voltage with each of the reference voltages, digitizes the comparison result into the binary digital output signal, and outputs the binary digital output signal.

Alternatively, in the above-mentioned on-chip signal waveform measurement apparatus, each of the signal probing front-end circuits preferably includes a source follower circuit, a voltage-to-current converter, a sample hold circuit, and a comparator. The source follower circuit buffer-amplifies the voltage at each of the detection points based on each of the enable timing signals, and the voltage-to-current converter converts the buffer-amplified voltage into a current. The sample hold circuit sample-holds the converted current. The comparator compares a sample-held current with the reference current converted from each of the reference voltages, digitizes the comparison result into the binary digital output signal, and outputs the binary digital output signal.

In the above-mentioned on-chip signal waveform measurement apparatus, the source follower circuit of each of the signal probing front-end circuits preferably includes a plurality of source followers having input voltage ranges different from each other, respectively. Each of the signal probing front-end circuits preferably includes a selector circuit for sequentially selecting the plurality of source followers. In this case, each of the signal probing front-end circuits has an input voltage range wider than the input voltage range of each of the plurality of source followers.

In the above-mentioned the on-chip signal waveform measurement apparatus, the data processing unit preferably includes a counter circuit, and a shift register circuit. The counter circuit counts the number of times of the predetermined binary value (such as 1 or 0) of the multiplexed binary digital output signal outputted from the multiplexer. The shift register circuit calculates the judgment output probability for the detected voltage at each of the detection points detected by each of the signal probing front-end circuits based on the number of times of the predetermined binary value of the binary digital output signal counted by the counter circuit, and outputs serial data on the judgment output probability.

In the above-mentioned on-chip signal waveform measurement apparatus, the data processing unit outputs serial data on a constant judgment output probability when the detected voltage and the reference voltage are both constants.

According to another aspect of the present technology, there is provided a signal waveform measurement system including an on-chip signal waveform measurement apparatus. The on-chip signal waveform measurement apparatus is mounted on an IC chip, and is provided for measuring signal waveforms at a plurality of detection points on the IC chip. The on-chip signal waveform measurement apparatus preferably includes a reference voltage generator, a plurality of signal probing front-end circuits, a multiplexer, and a data processing unit. The reference voltage generator successively generates and outputs a plurality of reference voltages different from each other based on a predetermined timing signal. The signal probing front-end circuits are mounted so as to correspond to the detection points, respectively, and each of the signal probing front-end circuits buffer-amplifies a voltage at each of the detection points, compares the buffer-amplified voltage with each of the reference voltages, digitizes a comparison result into a binary digital output signal, and outputs the binary digital output signal. The multiplexer time-division-multiplexes the binary digital output signals from the signal probing front-end circuits, and outputs a multiplexed digital output signal. The data processing unit calculates and outputs a judgment output probability for a detected voltage at each of the detection points detected by each of the signal probing front-end circuits, by counting a number of times of predetermined binary value (such as 1 or 0) of the multiplexed binary digital output signal outputted from the multiplexer. The signal waveform measurement system preferably further includes a further data processing unit provided in an external apparatus other than the IC chip. The further data processing unit decides the detected voltage at each of the detection points using such a feature that a reference voltage, at which a gradient of a characteristic of the judgment output probability obtained as the comparison result of comparing each of the detected voltages with each of the reference voltages is substantially the maximum, is the detected voltage, based on the judgment output probability for the detected voltage at each of the detection points from the data processing unit.

In the above-mentioned signal waveform measurement system, the on-chip signal waveform measurement apparatus further includes a sampling timing signal generator, and a demultiplexer. The sampling timing signal generator generates an enable timing control signal obtained by multiplexing the plurality of enable timing signals based on a predetermined system clock and a predetermined master clock. The demultiplexer demultiplexes the enable timing control signal to generate and output the enable timing signals for allowing the respective signal probing front-end circuits to sequentially operate. The sampling timing signal generator preferably includes a replica DLL circuit, and a delay signal generator circuit. The replica DLL circuit generates and outputs a predetermined reference bias voltage in synchronization with the system clock signal based on the system clock signal. The delay signal generator circuit generates a current obtained by dividing a reference current corresponding to the reference bias voltage by the number "n" (where "n" is a number equal to or larger than one) based on the master clock signal and the reference bias voltage, generates a predetermined delay time by multiplying a time for electrically charging an output load capacitance by the number "n" based on the generated current, and delays the master clock signal by the delay time, to generate the enable timing control signal obtained by multiplexing the plurality of enable timing signals. The replica DLL circuit generates the reference bias voltage so that the delay time is equal to a cycle of the system clock signal, and then, the delay signal generator circuit generates the enable timing control signal obtained by multiplexing the plurality of enable timing signals.

In the above-mentioned signal waveform measurement system, the further data processing unit sequentially stores the data on the judgment output probability from the data processing unit in a storage device, compares the data on the judgment output probability from the data processing unit with up-to-date data on the judgment output probability latest stored in the storage device, and stores the data on the judgment output probability from the data processing unit only when the data is different from the up-to-date data, then storing only the data on the judgment output probability only in a transition region near a region, in which the gradient of the characteristic of the judgment output probability obtained as the comparison result of comparing the each of the detected voltages with each of the reference voltages is substantially the maximum in the storage device.

According to a further aspect of the present technology, there is provided a sampling timing signal generator for generating a plurality of enable timing signals based on a predetermined system clock signal and a predetermined master clock signal. The sampling timing signal generator includes a replica DLL circuit, and a delay signal generator circuit. The replica DLL circuit generates a predetermined reference bias voltage in synchronization with the system clock signal based on the system clock signal, and outputs the reference bias voltage. The delay signal generator circuit generates a current obtained by dividing a reference current corresponding to the reference bias voltage by a number "n" (where "n" is a number equal to or larger than one) based on the master clock signal and the reference bias signal, generating a predetermined delay time by multiplying a time for electrically charging an output load capacitance by the number "n" based on the generated current, and delays the master clock signal by the delay time, to generate an enable timing control signal obtained by multiplexing the plurality of enable timing signals. The replica DLL circuit generates the reference bias voltage so that the delay time is equal to a cycle of the system clock signal, and then, the delay signal generator circuit generates the enable timing signals.

Therefore, the signal waveform measurement apparatus and the signal waveform measurement system according to the present technology is configured so that each of the signal probing front-end circuits is mounted to correspond to each detection point, the judgment output probability for the detected voltage at each detection point is calculated and outputted based on the binary digital output signal from each signal probing front-end circuit, and the detected voltage is decided based on the judgment output probability. Accordingly, it is possible to acquire waveforms at multiple observation points such as those of internal signals of the functional circuits that constitute the system LSI, and noises of the power source voltage, the ground voltage, the well voltage, and the substrate voltage on the LSI chip at higher speed with a precision higher than those of the prior art. In addition, a test cost of the system LSI required by the multi-channel on-chip waveform acquisition can be reduced, and design reliability can be remarkably improved.

Moreover, the sampling timing signal generator according to the present technology is configured as follows. The predetermined reference bias voltage is generated in synchronization with the system clock signal based on the system clock signal, the reference bias voltage is outputted, a current obtained by dividing a reference current corresponding to the reference bias voltage by a number "n" (where "n" is a number equal to or larger than one) is generated based on the master clock signal and the reference bias signal, and a predetermined delay time is generated by multiplying a time for electrically charging an output load capacitance by the number "n" based on the generated current. An enable timing control signal obtained by multiplexing the plurality of enable timing signals is generated by delaying the master clock signal by the delay time, and the reference bias voltage is generated so that the delay time is equal to a cycle or period of the system clock signal. Thus the enable timing signals are generated. Therefore, it is possible to provide the sampling timing signal generator for use in the signal waveform measurement system, the sampling timing signal generator having operation noise smaller than that of prior art and being better suited for the on-chip signal waveform measurement apparatus.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 23 is a block diagram showing a configuration of the signal waveform measurement system according to the second example embodiment;

DETAILED DESCRIPTION OF THE PREFERRED EMBODIMENTS

Preferred embodiments of the present invention will be described hereinafter with reference to the drawings. In the preferred embodiments, components similar to each other are denoted by the same numerical references, respectively.

First Preferred Embodiment

Embodiments of the present technology will be described hereinafter with reference to the drawings. In the example embodiments, components similar to each other are denoted by the same numerical references, respectively.

Figure 1:
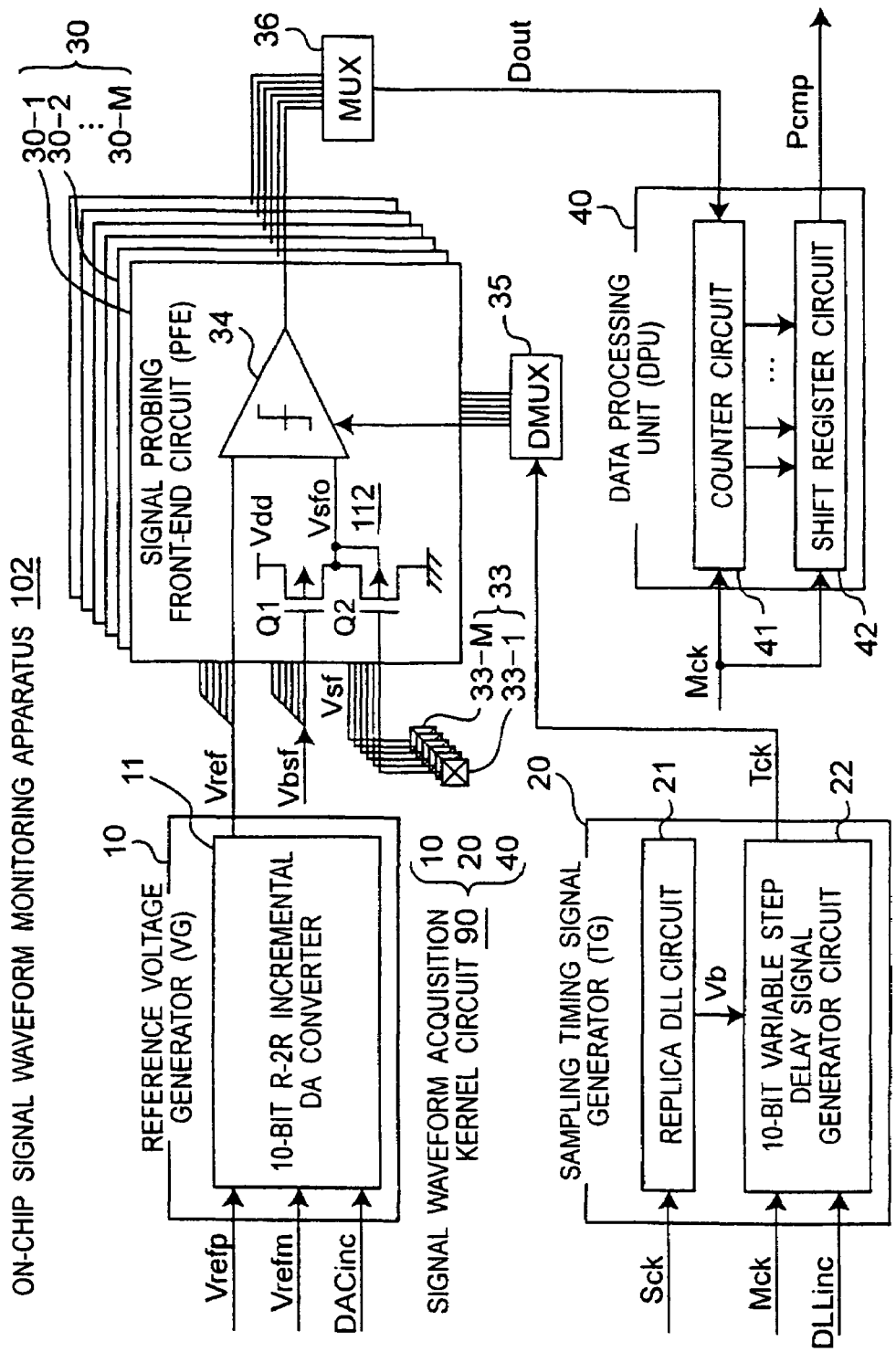
FIG. 1 is a block diagram showing a configuration of an on-chip signal waveform monitoring apparatus 102 according to a first example embodiment.
Figure 2:
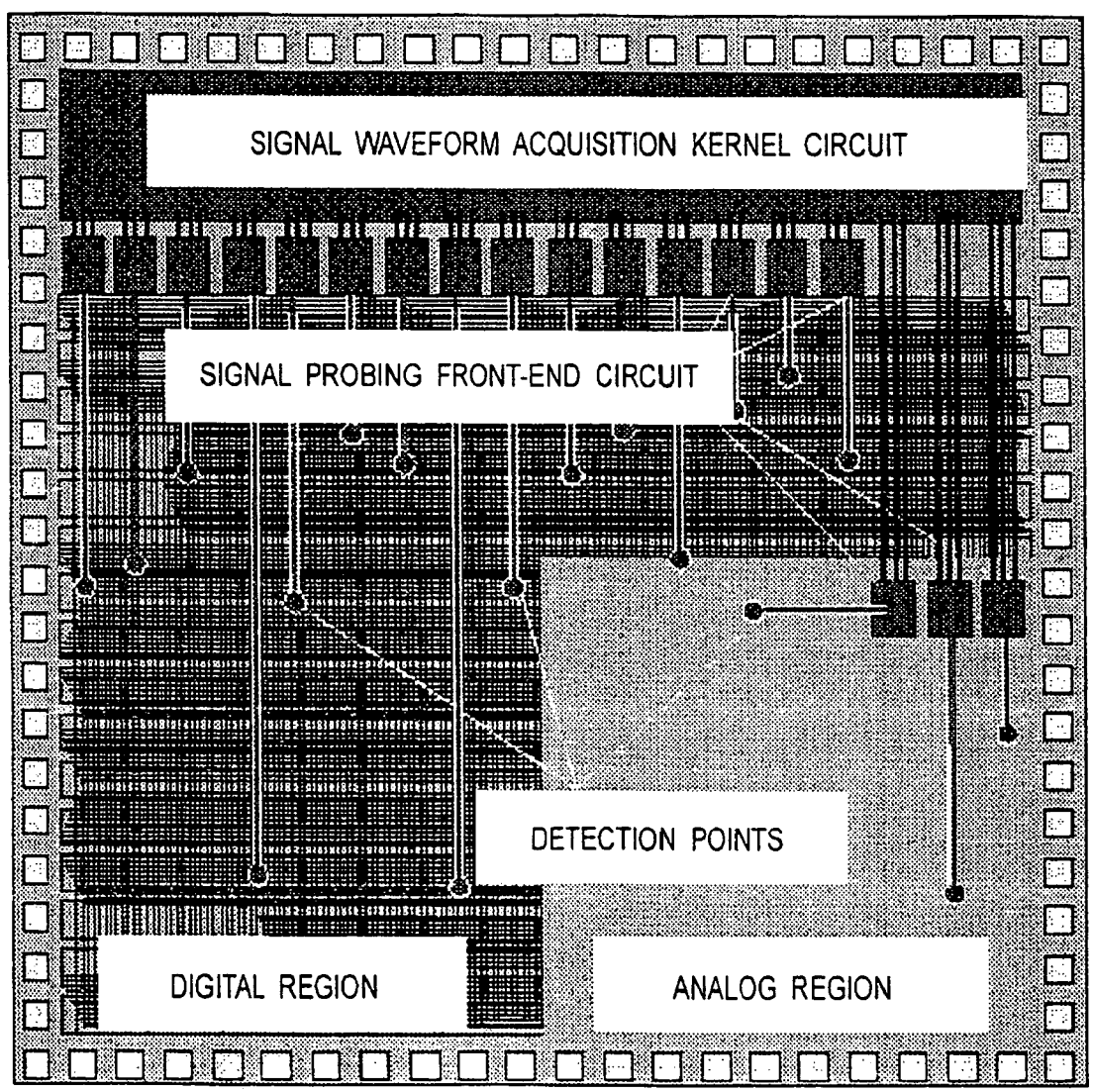
FIG. 2 is a plan view showing a floor plan of a system LSI on which the on-chip signal waveform monitoring apparatus shown in FIG. 1 is mounted.

Referring to FIG. 1, the on-chip signal waveform monitoring apparatus 102 includes signal probing front-end circuits (PFE) including M signal probing front-ends 30-1 to 30-M (generically denoted by numerical reference 30), a reference voltage generator (VG) 10, a sampling timing signal generator (TG) 20, and a data processing unit (DPU) 40, and is mounted on a single LSI chip. In FIG. 2, the three circuits 10, 20, and 40 are generically referred to as a signal waveform acquisition kernel circuit 90.

In this case, the signal probing front-end circuits 30 include not only a function of detecting a signal under test at M detection points 33-1 to 33-M (generically denoted by numerical reference 33), respectively, but also functions of sampling the signal under test and comparing the same signal with the respective reference voltages. As a result, multiplexing of the signal waveform acquisition kernel circuit 90 can be restricted to a digital signal system such as a sampling clock and a comparator output, and a DC signal system such as the reference voltage and a bias voltage. By avoiding multiplexing of the detected signals themselves, it is possible to suppress deterioration in measurement precision due to multi-channeling (See FIG. 1). That is, a multiplexed enable timing control signal Tck consisting of a plurality of enable timing signals from the sampling timing signal generator 20 is subjected to demultiplexing by a demultiplexer 35. The plurality of enable timing signals for allowing the respective signal probing front-end circuits 30 to sequentially and selectively operate are sequentially and selectively outputted to the respective signal probing front-end circuits 30. Then, the respective signal probing front-end circuits 30 can sequentially and selectively operate. In addition, the digital output signals from the respective signal probing front-end circuits 30 thus operating are time-division multiplexed by a multiplexer 36, and a resultant digital output signal Dout is outputted to the data processing unit 40. In addition, as shown in FIG. 2, the on-chip signal waveform monitoring apparatus 102 is configured so that the M signal probing front-end circuits 30 are arranged near the respective detection points 33, and further, the signal waveform acquisition kernel circuit 90 is arranged in free areas at the side edge or edge part of the LSI chip. This makes it possible to suppress an increase in an area of the LSI chip. Further, a digitization function (or A/D conversion function) of each of the signal probing front-cnd circuits 30 makes it possible to avoid precision deterioration factors due to the multi-channeling resulting from a crosstalk between long-distance wirings or the like.

The signal waveform acquisition kernel circuit 90 controls the digitization operation of the signal probing front-end circuits 30 so that the reference voltage and the sampling timing monotonously increase for every discrete step unit. Further, the following circuit is also mounted on the LSI chip, and the circuit counts the number of times of "one" of binary digital output signals obtained as comparison results of comparators 34 of the respective signal probing front-end circuits 30 at certain times' intervals in each step, and sequentially and serially outputs data on the counted values as signals indicating judgment output probabilities Pcmp. For example, for $2^{10}$ times of comparison operation, the signals indicating the judgment output probabilities Pcmp of the signal probing front-end circuits 30 can be read in about ten clock cycles or periods at most. Therefore, sufficient buffering time for storing data in an on-chip memory of an external apparatus mounted outside of the on-chip signal waveform monitoring apparatus 102 can be established, and any on-chip memory is not necessary. Furthermore, a digital value can be decided only by allowing a tester or a personal computer to perform a concurrent processing on the data stored in the memory. The apparatus 102 does not need to include any feedback function for generation of the reference voltage. As a result of such a control method, an area of the data processing unit 40 can be made quite small, and the apparatus 102 can be connected to the external apparatus using at most smaller I/O pins. Further, it is possible to remarkably reduce the on-chip signal measurement time (for example, to one-twentieth or less of the measurement time required by the prior art method), as compared with the prior art method for generating all the signals in an external measurement unit.

The on-chip signal waveform monitoring apparatus 102 according to the first preferred embodiment of the present invention can characteristically avoid deterioration of detection performance, and increases on an LSI chip area and the number of pins due to multiple measurement points, and can accelerate signal acquisition. As a consequence, the first preferred embodiment of the present invention can be expected to expand into application areas such as quantization of a sensitivity model and extraction of on-chip parameters based on an on-chip analog function evaluation and an on-chip operation fault analysis on a mixed signal system LSI and on correlation analysis of waveform deterioration in an analog signal and a peripheral noise. Moreover, since it is unnecessary to provide an external analog signal generator for use in these measurements, the mixed signal system LSI can be evaluated by a digital LSI tester and a measurement cost can be remarkably reduced.

The features of the configuration of the first example embodiment and the advantageous effects of the features are as follows.

(1) The respective signal probing front-end circuits 30 are arranged near the corresponding detection points 33, respectively, and the signal waveform acquisition kernel circuit 90 is shared among the probing front-end circuit 30. Therefore, it is possible to reduce the effective area of the LSI chip.

(2) The digitalization function (or A/D conversion function) is mounted on each of the signal probing front-end circuits 30. This leads to that the deterioration in precision due to the multi-channeling can be suppressed.

(3) By integrating generation of analog signals on single LSI chip, the digital LSI tester can diagnose the operation of the mixed signal system LSI.

(4) Mounting of the data processing unit 40 (consisting of a counter circuit 41 and a shift register circuit 42), that repeatedly outputs judgment output probabilities Pcmp from the comparators 34 of the signal probing front-end circuits 30 at intervals of certain numbers of clocks, leads to remarkable reduction in the signal acquisition time.

(5) The on-chip waveform acquisition mechanism of the on-chip signal waveform monitoring apparatus 102 according to the first preferred embodiment is combined with the high-linearity and wideband on-chip noise detection method verified by the circuit consisting of the source follower circuit and the latch comparator according to the prior art. Therefore, it is possible to reduce the measurement time to one-twentieth or less of the measurement time of the prior art. As a result, multiple observation point measurements such as the correlation measurement between the signal waveform in an analog function module and a noise waveform of a peripheral substrate and the analysis of a dynamic and complex operation fault caused by a plurality of aspects of the mixed signal system LSI that cannot be conventionally realized can be realized.

(6) By mounting the signal probing front-end circuits 30 that are multi-channel on-chip signal probing circuits on the apparatus 102, it is possible to realize improvement in a certainty of design. Concretely, this can be realized by a method of performing the quantization of the sensitivity model and extraction of the parameters based on the correlation analysis between the waveform deterioration of the analog signal and the peripheral noise.

The first preferred embodiment of the present invention and an implemental example of the first preferred embodiment will be described in detail hereinafter.

The objects and purposes of the first preferred embodiment according to the present invention are as follows. Since the LSI has been improved in function and performance, almost all LSIs are formed as mixed signal LSIs. However, problems such as a performance deterioration and an operation fault due to an interaction among circuit functions occur to many mixed signal LSIs. On-chip signal waveform acquisition is effective means for many purposes such as a circuit operation diagnosis, a power source noise analysis, a functional circuit performance verification, and a fault analysis. A study according to the present invention proposes a low-cost multi-channel on-chip signal monitoring method.

Next, outline of the first preferred embodiment according to the present invention and the implemental example of the first preferred embodiment will be described below.

(1) Applicable Field

The first preferred embodiment of the present invention can be used for an on-chip waveform acquisition, an operation verification and a performance verification of an analog/mixed signal LSI, a built-in self-test function (BIST) and the like.

(2) Features of Configuration

The on-chip signal waveform monitoring apparatus 102 according to the first preferred embodiment of the present invention is configured so that not only the signal probing front-end circuits 30 but also the signal waveform acquisition kernel circuit 90 serving as the waveform acquisition mechanism that generates signals required for waveform acquisition are integrated and mounted on single LSI chip. The M signal probing front-end circuits 30 share one signal waveform acquisition kernel circuit 90 serving as the waveform acquisition mechanism.

(3) Performance

The on-chip signal monitoring apparatus 102 according to the first preferred embodiment of the present invention can reduce the measurement cost and accelerate the waveform acquisition time while minimizing an area cost for providing the on-chip configuration. In addition, the apparatus 102 can realize multi-channeling without deterioration in detection precision.

(4) Prototype

In the implemental example of the first preferred embodiment of the present invention, an 8-channel on-chip signal waveform monitoring apparatus was prototyped on single LSI chip by a 0.18-µm CMOS process.

(5) Actual Measurement Performance

According to the implemental example of the first preferred embodiment of the present invention, a signal waveform was realized at a time resolution of 40 psec and a voltage resolution of 200 µV. As compared with providing only a detector circuit on single LSI chip, the measurement time can be reduced to 95% with maintaining the measurement precision.

Moreover, the appeal points and the advantageous effects of the first example embodiment are as follows. The multi-channel on-chip signal waveform monitoring apparatus 102 (FIG. 1) that includes the M signal probing front-end circuits 30 and the signal waveform acquisition kernel circuit 90 is proposed. The signal waveform acquisition kernel circuit 90 consisting of the sampling signal generator 20, the reference voltage generator 10, and the data processing unit 40 can be arranged in the free spaces at the side edge or edge part of the LSI chip. Therefore, this leads to that the area cost can be minimized. The digitalization function of each signal probing front-end circuit 30 can realize multi-channeling without any deterioration in the detection precision due to the crosstalk between the wirings. Further, according to the present technology, it is not necessary to provide any external analog signal generator and any complex measurement control, and this leads to reduction in the measurement cost. The prototyped on-chip signal waveform monitoring apparatus 102 in the implemental example realized the reduction of the measurement time to 95% (FIG. 20) with maintaining the equal waveform precision (FIGS. 18 and 19) to that according to the prior art. Indexes to be appealed by the present example embodiment are applicability, viability, completeness, potential, distributability, and the like.

Following expansion of an SOC (Systems On a Chip) market, the LSIs have been increasingly improved in function and performance. At present, almost all the LSIs are provided as mixed signal LSIs. In many mixed signal LSIs, since the circuits operate, functional circuits interfere with one another, and performance deteriorations occur such as deterioration in precision for digital to analog conversion and increases in jitters and skews in clock distribution in PLLs (phase-locked loops) and in critical paths of the circuits. The many system LSIs are faced with operation fault problems accordingly. Since such an LSI is configured so that many functions are combined on an LSI chip, operation states of the respective functional circuits cannot be observed from the outside of the LSI chip. On the other hand, for a high-rate low-power consumption LSI, it is more important to consider noises generated in the power source voltage, the ground voltage, the well voltage, and the substrate voltage. Therefore, the need of on-chip measurement and evaluation of the noises on the LSI chip increases.

The most ordinary method of solving the problems is to mount a function that measures internal signals on the LSI chip and make an on-chip signal measurement. The on-chip signal measurement not only exhibits a BIST operation test function but also serves as effective means for a power source noise analysis, a functional circuit performance verification, a fault analysis, and the like. The on-chip signal measurement is an essential technique for introducing and verifying an EDA (electric design automation) tool and improving a design flow. According to the present preferred embodiment, a method of configuring the on-chip multi-channel signal monitoring circuit capable of reducing the measurement cost and realizing high waveform precision is proposed. As related studies, a method of generating an on-chip analog test signal and detecting a signal waveform for analog and mixed signal LSI tests, and an on-chip oscilloscope macro for high-speed digital signals have been open to the public. Furthermore, on-chip measurements of the power source voltage and the ground voltage, a digital signal measurement, and a clock jitter measurement have been reported.

The configuration of the on-chip signal monitoring apparatus 102 will be described in detail hereinafter.

FIG. 1 is a system block diagram showing an entire device configured so that the circuits of the multi-channel on-chip signal waveform monitoring apparatus 102 are mounted on single LSI chip. FIG. 2 is a plan view showing a prototyped semiconductor LSI chip according to the implemental example of the present preferred embodiment. For signal probing or signal detection, a plurality of signal probing front-end circuits 30 each having a relatively small area are arranged near a functional circuit block and near the detection points 33, at which a signal under test is measured. The signal under test is probed or detected at the detection points 33 and detected signals are outputted from the respective signal probing front-end circuits 30. Only one signal waveform acquisition kernel circuit 90 that generates the necessary signals for waveform detection is arranged on the LSI chip, and is shared among the signal probing front-end circuits 30.

The on-chip signal waveform monitoring apparatus 102 shown in FIG. 1 is configured to include the following components:

(a) the signal waveform acquisition kernel circuit 90 consisting of the reference voltage generator (VG) 10, the sampling timing signal generator (TG) 20, and the data processing unit (DPU) 40; and (b) a plurality of or M signal probing front-end (PFE) circuits 30.

The reference voltage generator 10 includes a 10-bit R-2R incremental DA converter 11. The DA converter 11 generates the reference voltage Vref based on three inputted signals (a reference plus voltage Vrefp, a reference minus voltage Vrefm, and a DA converter increment signal DACinc (which is a reference voltage increment signal), and outputs the reference voltage Vref to the respective signal probing front-end circuits 30. The sampling timing signal generator 20 is configured to include the following components:

(a) a replica DLL (delayed locked loop) circuit 21 that generates a bias voltage Vb based on a system clock signal Sck, and outputs the bias voltage Vb to the delay signal generator circuit 22 (note that the circuit 21 is a replica circuit having a configuration similar to that of a DLL and is provided for generating a correct bias voltage in an environment closer to an actual environment as much as possible); and (b) the 10-bit variable step delay signal generator circuit 22 that generates an enable timing control signal Tck based on a master clock signal Mck and a DLL increment signal DLLinc (timing increment signal), and outputs the enable timing control signal Tck to the respective signal probing front-end circuits 30 through the demultiplexer 35.

The master clock signal Mck is generated by, for example, dividing the system clock signal Sck by four.

The demultiplexer 35 selects and operates the signal probing front-end circuits 30 in a time-division manner by demultiplexing the multiplexed enable timing signal Tck consisting of a plurality of enable timing signals from the delay signal generator circuit 22, and by outputting the respective enable timing signals to the signal probing front-end circuits 30. The digital output signals from the respective signal probing front-end circuits 30 are multiplexed by the multiplexer 36, and the resultant multiplexed digital output signal Dout is outputted to the counter circuit 41 of the data processing unit 40.

Each signal probing front-end circuit 30 is configured to include a source follower circuit 112 and a latch comparator 34. The source follower circuit 112 (which is represented as P-channel source follower circuit 112 of FIG. 2, and this circuit will be described later in detail) consists of two P-channel MOS field effect transistors (hereinafter, "MOSFETs") Q1 and Q2, buffer-amplifies the detected voltage Vsf from the corresponding detection point 33, and outputs the buffer-amplified detected voltage Vsf as a detected voltage Vsfo. The latch comparator 34 compares the detected voltage Vsf with the reference voltage Vref from the reference voltage generator 10 at a timing of each of the enable timing signals as included in the enable timing control signal Tck. In addition, the latch comparator 34 outputs the digital output signal obtained as a comparison result to the data processing unit 40 as a multiplexed digital output signal through the multiplexer 36. The data processing unit 40 is configured to include the 10-bit counter circuit 41 and the 10-bi shift register circuit 42. The counter circuit 41 calculates the judgment output probability Pcmp by counting the number of times of "one" of the multiplexed digital output signal for every comparison operation using the reference voltage Vref at each detection point 33. The shift register circuit 42 converts the calculated judgment output probability into 10-bit serial digital data Pcmp and outputs the data Pcmp. In other words, as described later in detail with reference to FIG. 5, the number of times of the binary value of "one" of the multiplexed digital output signal corresponds to the judgment output probability Pcmp per reference voltage Vref at each detection point 33. It is to be noted that the data processing unit 40 outputs serial data on a constant judgment output probability Pcmp when the detected voltage Vsfo and the reference voltage Vref are both constants.

Figure 3:
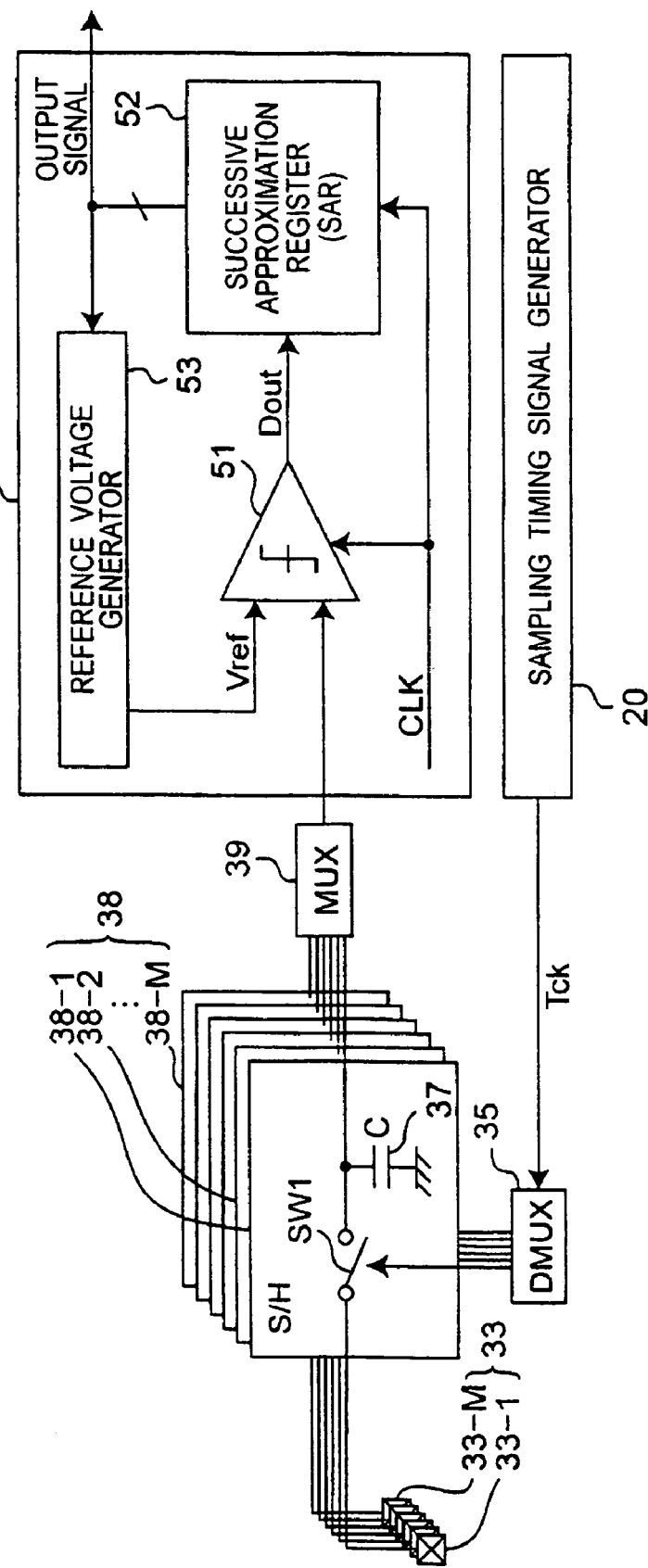
FIG. 3 is a block diagram showing a configuration of a multi-channel successive approximation type AD converter apparatus according to a prior art.

FIG. 3 is a block diagram showing a configuration of a multi-channel successive approximation type AD converter apparatus according to the prior art. The multi-channel successive approximation type AD converter apparatus shown in FIG. 3 is an ordinary AD converter apparatus configured to include M sample hold circuits 38-1 to 38-M (generically denoted by numerical reference 38) that sample and hold detected voltages at the respective detection points 33, an AD converter 50 including a SAR (successive approximation register) type comparator 51, a sampling timing signal generator 20, a multiplexer 39, and a demultiplexer 35. Each sample hold circuit 38 includes a switch SW11 that is turned on in response to an enable timing signal demultiplexed from an enable timing control signal Tck from the sampling timing signal generator 20 by the demultiplexer 35, and a capacitor 37 that accumulates voltage charges. In addition, the AD converter 50 includes the comparator 51, a successive approximation register (SAR) 52, and a reference voltage generator 53. According to the prior art thus configured as shown in FIG. 3, an analog signal path from the sample hold circuit 38 to the AD converter 50 is multiplexed by the multiplexer 39. As a result, the waveform precision deteriorates according to multi-channeling.

On the other hand, according to the preferred embodiment shown in FIG. 1, a common DC signal path is used for the bias voltage Vbsf, the reference voltage Vref and the like, and only a digital signal path for the enable timing control signal Tck and the digital output signal Dout is multiplexed. This leads to that multiplexing of the analog signal path is eliminated. Further, while only one signal probing front-end circuit 30 is allowed to exclusively operate using a state register (not shown in FIG. 1), all the other signal probing front-end circuits 30 are controlled to be cut off or turned off so as not to influence a waveform detection operation. Therefore, it is possible to avoid deterioration factors in the detection precision. It is noted that the enable timing control signal Tck from the delay signal generator circuit 22 is supplied only to the signal probing front-end circuit 30 selected by the state register through the demultiplexer 35.

In other words, the on-chip signal waveform monitoring apparatus 102 according to the present preferred embodiment is characterized by being configured to connect a plurality of signal probing front-end circuits 30 to one signal waveform acquisition kernel circuit 90. If the number of detection points 33 is to be increased, it suffices to increase only the signal probing front-end circuits 30 each having a small area, and to arrange only one signal waveform acquisition kernel circuit 90 in the free space after the SOC layout design. Then this leads to suppression in the on-chip cost.

In the on-chip signal waveform monitoring apparatus 102 according to the present preferred embodiment, the reference voltage generator 10 employs the incremental DA converter 11. This leads to that it is dispensed with a search control function corresponding to the successive approximation register (SAG) 52. Further, the signal probing front-end circuits 30 of the on-chip signal waveform monitoring apparatus 102 according to the present preferred embodiment repeatedly compare the detected voltages Vsf with the reference voltage Vref using the respective latch comparator 34 based on the sampling principle so as to perform the statistic processing. This leads to that a sampling capacitance is substituted. The detailed operation of the circuit 30 will be described later.

Figure 4:
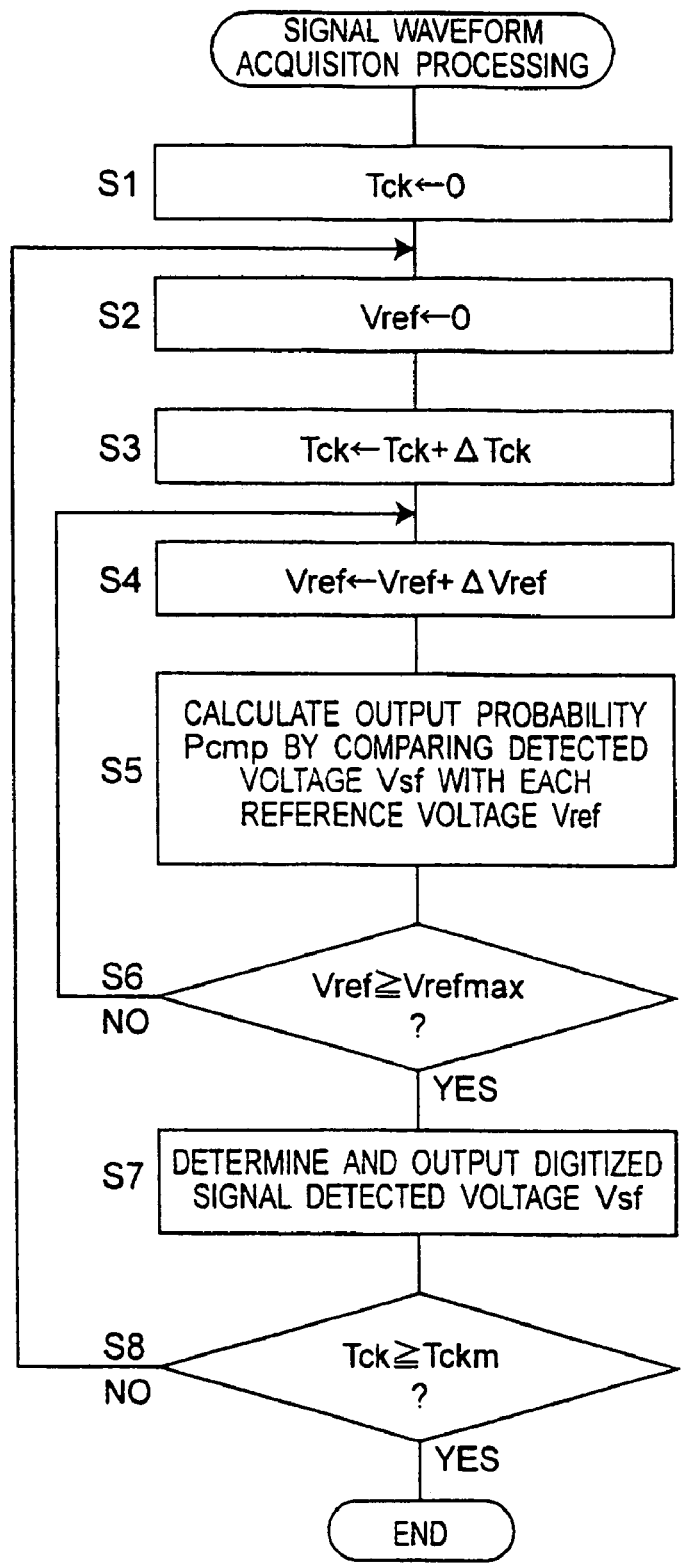
FIG. 4 is a flowchart showing a signal waveform acquisition processing executed by the on-chip signal waveform monitoring apparatus 102 according to the first preferred embodiment.
Figure 5:
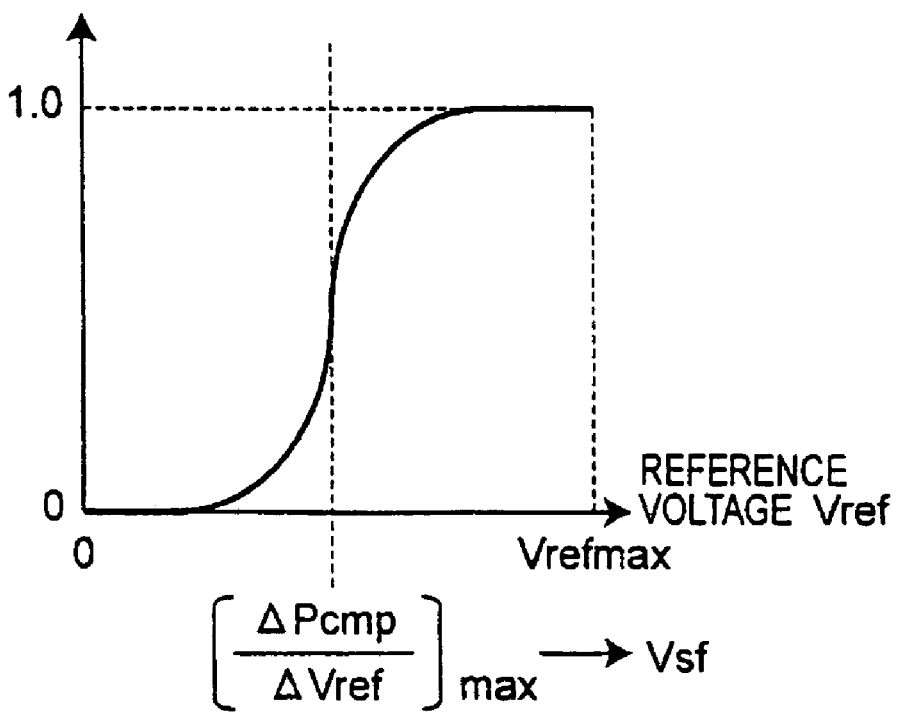
FIG. 5 is a graph showing a judgment output probability Pcmp relative to a reference voltage Vref in the signal waveform acquisition processing shown in FIG. 4.

The signal waveform acquisition processing according to the present preferred embodiment and the measurement cost of the apparatus 102 will be described hereinafter. FIG. 4 is a flowchart showing the signal waveform acquisition processing executed by the on-chip signal waveform monitoring apparatus 102 according to the first preferred embodiment. FIG. 5 is a graph showing the judgment output probability Pcmp relative to the reference voltage Vref in the signal waveform acquisition processing shown in FIG. 4.

As apparent from FIG. 4, the signal waveform acquisition processing consists of double loops of a sampling timing loop of changing the enable timing control signal Tck and a reference voltage loop of changing the reference voltage Vref. The reference voltage generator 10 and the sampling timing signal generator 20 are repeatedly incremented and allowed to operate in the respective loops. As apparent from FIG. 5, as the reference voltage Vref is higher, the judgment output probability Pcmp (the probability of the number of times at which the comparator 34 outputs the output binary value of "one". In the preferred embodiment, the output binary value of "one" is counted, however, the present invention is not limited to this, and the output binary value of "zero" may be counted if the resulting binary value from the latch comparator 34 is reversed)) of the latch comparator 34 is larger. The curve has the maximum gradient at a certain point in a transition region, and it is estimated that the point corresponds to the detected voltage Vsf. Namely, as can be seen from FIG. 5, the number of times of "one" of the binary digital output signal from the comparator 34 corresponds to the judgment output probability Pcmp per reference voltage Vref at each detection point 33.

In the signal waveform acquisition processing shown in FIG. 4, the enable timing control signal Tck is reset to zero at step S1, the reference voltage Vref is reset to zero at step S2, and the enable timing control signal Tck is delayed by as much as a predetermined delay time ΔTck at step S3. At step S4, the reference voltage Vref is increased by a predetermined incremental voltage ΔVref. At step S5, the judgment output probability Pcmp of the latch comparator 34 is calculated by comparing the detected voltage Vsf with each reference voltage Vref. At step S6, it is judged whether or not Vref≧Vrefmax is satisfied (where Vrefmax represents the maximum value of the reference voltage Vref as shown in FIG. 5 and is equal to the reference plus voltage Vrefp in the present preferred embodiment). If YES at step S6, the control flow goes to step S7. On the other hand, if NO at step S6, the control flow returns to step S4. At step S7, the digitized signal detected voltage Vsf is determined and outputted based on the features or characteristics of the calculated judgment output probability Pcmp, and then, the control flow goes to step S8. At step S8, it is judged whether or not Tck≧Tckm is satisfied (where Tckm represents the maximum time of the timing clock signal). If NO at step S8, the control flow returns to step S2. On the other hand, if YES at step S8, the signal waveform acquisition processing is completed. At step S5, the judgment output probability Pcmp of the latch comparator 34 is calculated by performing 210 comparison operations in all.

In the signal waveform acquisition processing shown in FIG. 4, the reference voltage Vref is increased by the predetermined incremental voltage ΔVref. However, the present invention is not limited to this. A signal waveform may be acquired by changing the reference voltage Vref so as to be decreased from the maximum value of the reference voltage Vref.

Figure 6:
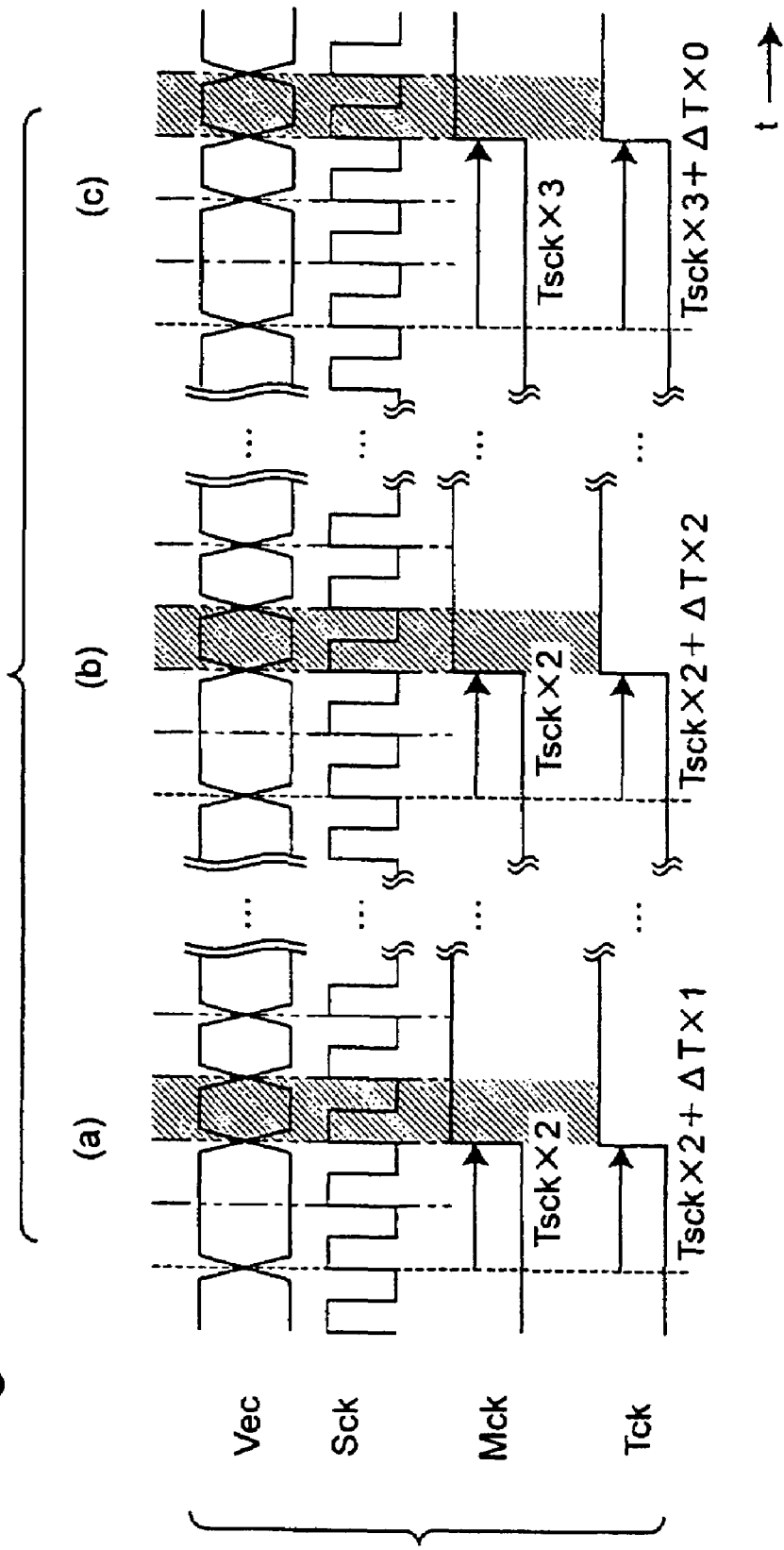
FIG. 6 is a timing chart showing generation of an enable timing control signal Tck generated by a sampling timing signal generator 20 shown in FIG. 1.

FIG. 6 is a timing chart showing generation of the enable timing control signal generated by the sampling timing signal generator 20 shown in FIG. 1. As shown in (a) of FIG. 6, the sampling timing signal generator 20 generates the enable timing control signal Tck obtained by adding an arbitrary delay time ΔT to a signal transition timing (represented by a timing signal Tsck) of the master clock signal Mck per transition of a falling signal of the master clock signal Mck. The delay time ΔT given by the sampling timing signal generator 20 is normalized to the system clock signal Sck using the replica DLL circuit 21. Each signal probing front-end circuit 30 repeatedly compares the detected voltage Vsf (which is the output voltage Vsfo of the source follower circuit 112 of the circuit shown in FIG. 1) with the reference voltage Vref generated by the reference voltage generator 10 at the timing of each enable timing signal as included in the enable timing control signal Tck generated by the sampling timing signal generator 20. In the processing in step S5 using each reference voltage Vref, the comparison processing is repeated $2^{10}$ times, the data processing unit 40 executes the processing on the comparison result, and then, calculates the judgment output probability Pcmp of the latch comparator 34. Whenever the judgment output probability Pcmp is calculated by the processing at step S5 using each reference voltage Vref, the reference voltage Vref is incremented one step by one step. The detected voltage Vsf is defined as the point ΔPcmp/ΔVref (See FIG. 5) having the maximum gradient in the transition region of the latch comparator 34. Whenever the reference voltage generator 10 is incremented by a 10-bit step, a value of the 10-bit reference voltage Vref corresponding to the detected voltage Vsf is calculated. When the detected voltage Vsf is determined by each enable timing signal as included in the enable timing control signal Tck, then the sampling timing signal generator 20 increments a timing step as the enable timing control signal Tck shown in (b) of FIG. 6 and the reference voltage Vref loop processing is repeated again. If the enable timing control signal Tck from the sampling timing signal generator 20 is incremented by the 10-bit step, the sampling timing signal generator 20 is reset. As shown in (c) of FIG. 6, the master clock signal Mck is shifted by one system clock and the reference voltage Vref loop processing is executed again. By repeatedly performing this operation in an arbitrary region, the detected voltage Vsf is digitized on single LSI chip and continuous time data on the detected voltage Vsf is acquired in the form of a digital value.

Figure 7:
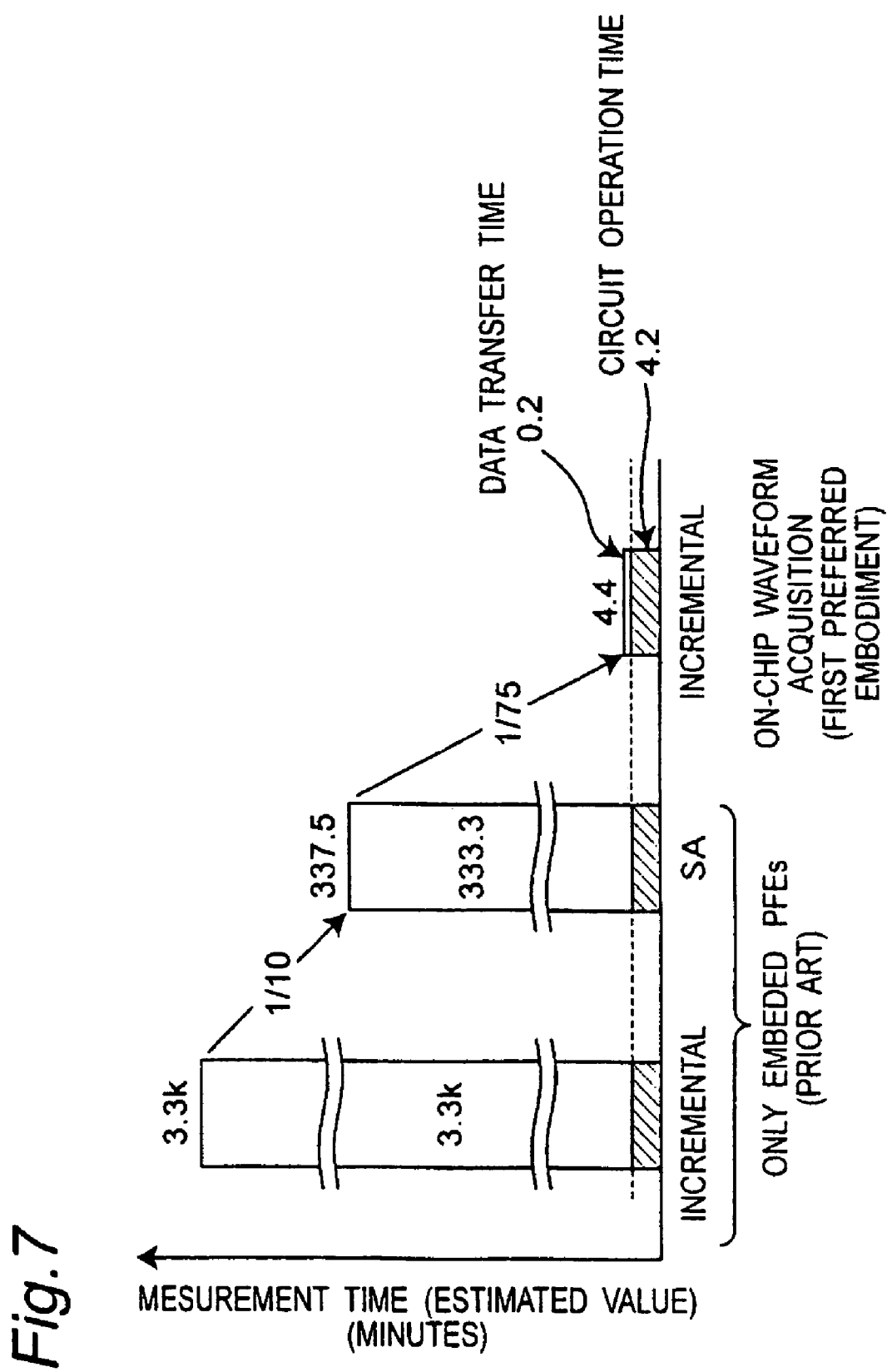
FIG. 7 is a graph showing measurement times (estimated values) for signal waveform acquisition, where the measurement times include a measurement time required by a signal waveform monitoring apparatus (only embedded PFEs) according to the prior art, and a measurement time required by the on-chip signal waveform monitoring apparatus 102 according to the first preferred embodiment.

FIG. 7 is a graph showing measurement times (estimated values) for signal waveform acquisition, where the measurement times include a measurement time required by a signal waveform monitoring apparatus (only embedded PFEs) according to the prior art, and a further measurement time required by the on-chip signal waveform monitoring apparatus 102 according to the first preferred embodiment. According to the conventional method disclosed in the Non-Patent Documents 1 and 2, the inventors of the present invention realized the signal waveform acquisition for the signals required for the signal waveform acquisition by integrating only the signal probing front-end circuits 30 on single LSI chip and controlling an external measurement unit by a personal computer. However, the entire number of times of repeating the loops in the proposed signal waveform acquisition processing amounted to in the order of $10^9$, it was necessary to access and control the external measurement unit by an enormous number of times, and it took long measurement time for the waveform detection.

FIG. 7 shows the rough measurement times (evaluated values) required for the signal waveform detection when the voltage was measured at 1024 points. If only the signal probing front-end circuits 30 are integrated and mounted on single LSI chip as disclosed in the prior art and a simple algorithm having a simple increment for the reference voltage Vref loop processing, it takes quite long measurement time for the waveform detection. If a binary search algorithm is applied to the reference voltage Vref loop (applied to the successive approximation (SA) type AD converter circuit of FIG. 3), then the measurement time can be reduced to about one-tenth but the measurement time is still as long as five hours or more. On the other hand, if the proposed on-chip signal waveform monitoring apparatus 102 according to the present preferred embodiment shown in FIG. 1 is integrated and mounted on the LSI chip and the on-chip signal waveform monitoring apparatus 102 is allowed to operate at 4 MHz, the measurement time for the signal waveform acquisition can be reduced to about four minutes. A high time efficiency waveform measurement is an important factor for a test mechanism, and it is one of the objects of the present invention to realize the waveform measurement at higher time efficiency.

In order to mount the proposed on-chip signal waveform monitoring apparatus 102 on the LSI chip, a chip area is required on the LSI chip. However, since it is unnecessary to provide the measurement unit that generates a more correct analog signal in the external apparatus, the mixed signal LSI can be evaluated by a digital measurement apparatus such as a digital LSI tester. This leads to great reduction in the measurement cost.

The circuit configuration of the on-chip signal waveform monitoring apparatus 102 will be described in detail hereinafter.

Figure 8:
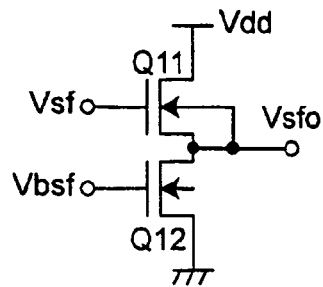
FIG. 8 is a circuit diagram showing a configuration of an N channel source follower circuit 111 employed in a signal probing front-end circuit 30 shown in FIG. 1.
Figure 9:
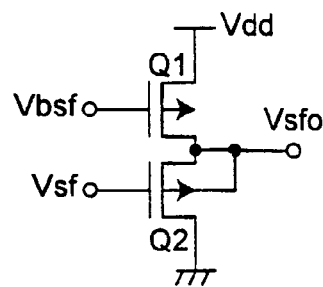
FIG. 9 is a circuit diagram showing a configuration of a P channel source follower circuit 112 employed in the signal probing front-end circuit 30 shown in FIG. 1.
Figure 10:
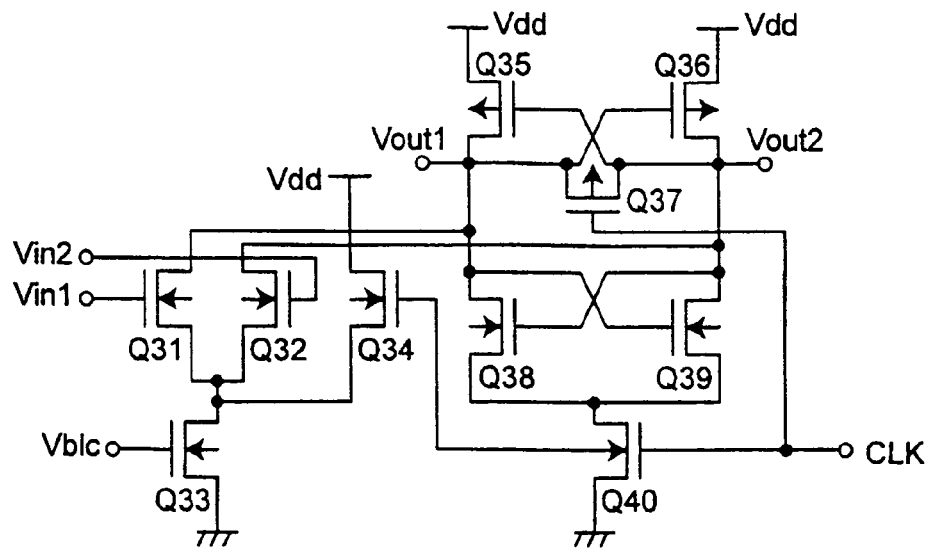
FIG. 10 is a circuit diagram showing a configuration of a latch comparator 134 employed in the signal probing front-end circuit 30 shown in FIG. 1.

FIG. 8 is a circuit diagram showing a configuration of an N channel source follower circuit 111 employed in each signal probing front-end circuit 30 shown in FIG. 1. FIG. 9 is a circuit diagram showing a configuration of a P channel source follower circuit 112 employed in the signal probing front-end circuit 30 shown in FIG. 1. FIG. 10 is a circuit diagram showing a configuration of a latch comparator 34 employed in the signal probing front-end circuit 30 shown in FIG. 1.

Referring to FIGS. 8 and 9, Vbsf denotes a bias voltage, and Vsf denotes a detected voltage at the detection point 33. The signal probing front-end circuit 30 is configured to connect the N channel source 111 or 112 of the signal probing front-end circuit 30 functions not only to buffer the detected voltage signal but also to electrically isolate the on-chip signal waveform monitoring apparatus 102 from the voltage signal to be measured so as to suppress interference between them. In this case, the proposed signal probing front-end circuit 30 enables realizing the on-chip signal waveform monitoring apparatus 102 that can measure on-chip signal waveforms having various attributes in the mixed signal LSI.

Figure 11:
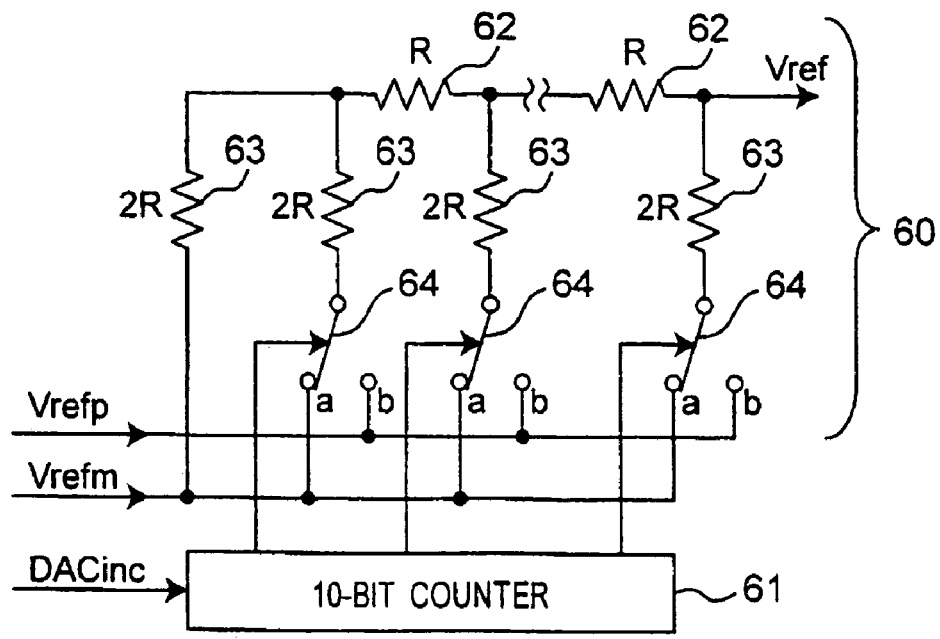
FIG. 11 is a block diagram showing a configuration of a reference voltage generator 10 shown in FIG. 1.
Figure 12:
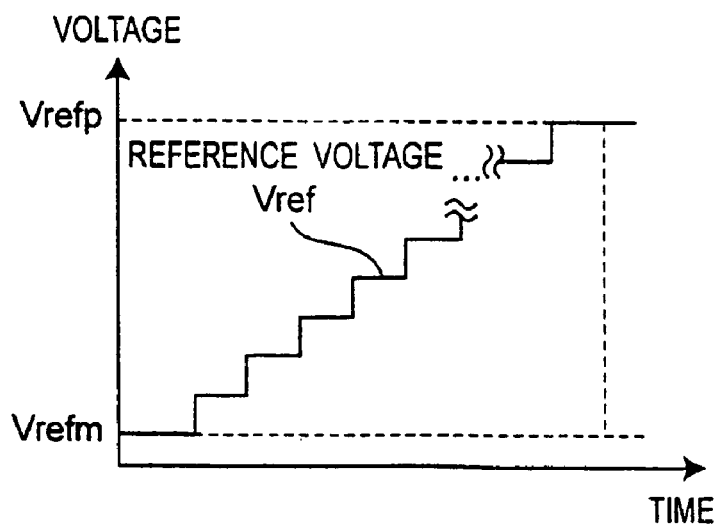
FIG. 12 is a timing chart showing the reference voltage Vref generated by the reference voltage generator 10 shown in FIG. 11.

FIG. 11 is a block diagram showing a configuration of the reference voltage generator 10 shown in FIG. 1. FIG. 12 is a timing chart showing the reference voltage Vref generated by the reference voltage generator 10 shown in FIG. 11. In FIG. 11, the reference voltage generator 10 is configured to include the following components:

(a) a 10-bit R2-R ladder circuit 60 that includes a plurality of resistors 62 each having a resistance value R, a plurality of resistors 63 each having a resistance value 2R, and a plurality of switches 64, and that generates a minor voltage step between the reference plus voltage Vrefp and the reference minus voltage Vrefm both from the external apparatus; and (b) a 10-bit counter 61 that counts DA converter increment signals DACinc, and that controls the switches 64 to be turned on or off based on a count value.

As shown in FIG. 12, the reference voltage generator 10 operates as the 10-bit incremental DA converter 11.

The method of using a VCDL (voltage-controlled delay line) to generate the enable timing control signal Tck according to the prior art has the following problems. The circuit scale is made large exponentially according to an increase in the number of bits of a delay step (delay time). follower circuit 111 consisting of two N channel MOSFETs Q11 and Q12 or the P channel source follower circuit 112 consisting of two P channel MOSFETs Q1 and Q2 to the latch comparator 34. The two types of the signal probing front-end circuits 30 (that is, the P channel signal probing front-end circuit and the N channel signal probing front-end circuit) are used depending on a DC level of a voltage signal to be detected. If the DC level of the voltage signal to be detected is fallen within a range from 0 V to Vdd (power source voltage)-Vthp (a threshold voltage of the P channel MOSFET), the P channel signal probing front-end circuit 30 is used. If the DC level is fallen within a range from Vthn (a threshold voltage of the N channel MOSFET) to the power source voltage Vdd, the N channel signal probing front-end circuit 30 is used. For an analog signal having a DC level of a voltage of about Vdd/2 in an analog circuit, either the P channel signal probing front-end circuit 30 or the N channel signal probing front-end circuit 30 can be used. If a power source voltage of 3.3 V is used for an input and output interface, a full range of an input voltage can be detected only by the P channel signal probing front-end circuit 30 for a low voltage power source circuit having a power source voltage of 1.2 V. In order to make the latch comparator 34 smaller in area, a well-known differential latch comparator including ten MOSFETs Q31 to Q40 and having a simple topology as shown in FIG. 10 is used as the latch comparator 34. The entire signal probing front-end circuits 30 according to the implemental example have a gain of zero dB and a frequency band of 1 GHz.

Figure 13:
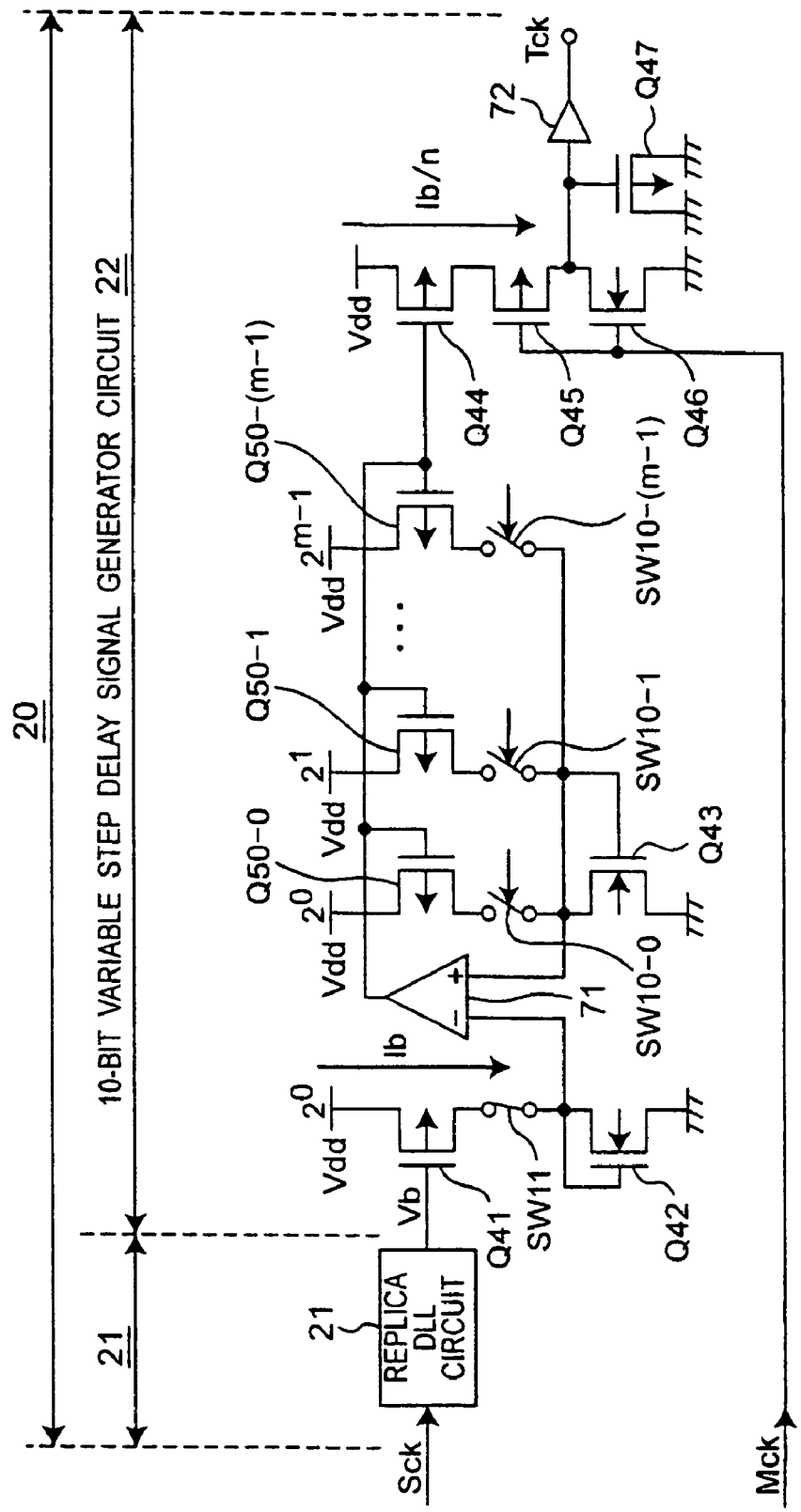
FIG. 13 is a circuit diagram showing a configuration of a sampling timing signal generator 20, that includes a replica DLL circuit 21 and a 10-bit variable step delay signal generator circuit 22 shown in FIG. 1.

It is necessary to design the signal probing front-end circuit 30 so as to minimize an influence of the circuit 30 on the device under test (DUT) which is a measurement target circuit in the on-chip signal waveform acquisition processing. Due to this, the source follower circuit In addition, since all delay cells always operate in response to an edge of an input signal, many noises are generated. Since the same problems occur to a timing interpolator using a vernier topology, the timing interpolator is not suited as a timing generator circuit for on-chip signal monitoring. Under the circumstances, the sampling timing signal generator 20 shown in FIG. 20 was developed. FIG. 13 is a circuit diagram showing a configuration of the sampling timing signal generator 20 that includes the replica DLL circuit 21 and the 10-bit variable step delay signal generator circuit 22 shown in FIG. 1. The variable step delay signal generator circuit 22 multiplies a reference bias current Ib by "1/n" (where "n" is preferably a natural number equal to or larger than one if the digital processing according to the present preferred embodiment is executed, but may be a number equal to or larger than one such as 1.5, 2.6 or the like). In this case, the circuit 22 multiplies the time for electrically charging an output load capacitance by the number "n", and generates an arbitrary delay time $T_{delay}$:

$$T_{delay}(n) = n \times T_{delay}(0) \tag{1}$$

In the Equation (1), $T_{delay}(n)$ denotes time taken from a falling transition of the mater clock signal Mck, which is an inputted clock signal to a rising transition of the enable timing control signal Tck which is outputted clock signal. $T_{delay}(0)$ denotes the minimum delay time. The reference bias current Ib is adjusted by the bias voltage Vb from the replica DLL circuit 21 so that the longest delay time $T_{delay}(2m)$ is equal to a clock cycle or period of the system clock signal Sck.

Figure 14:
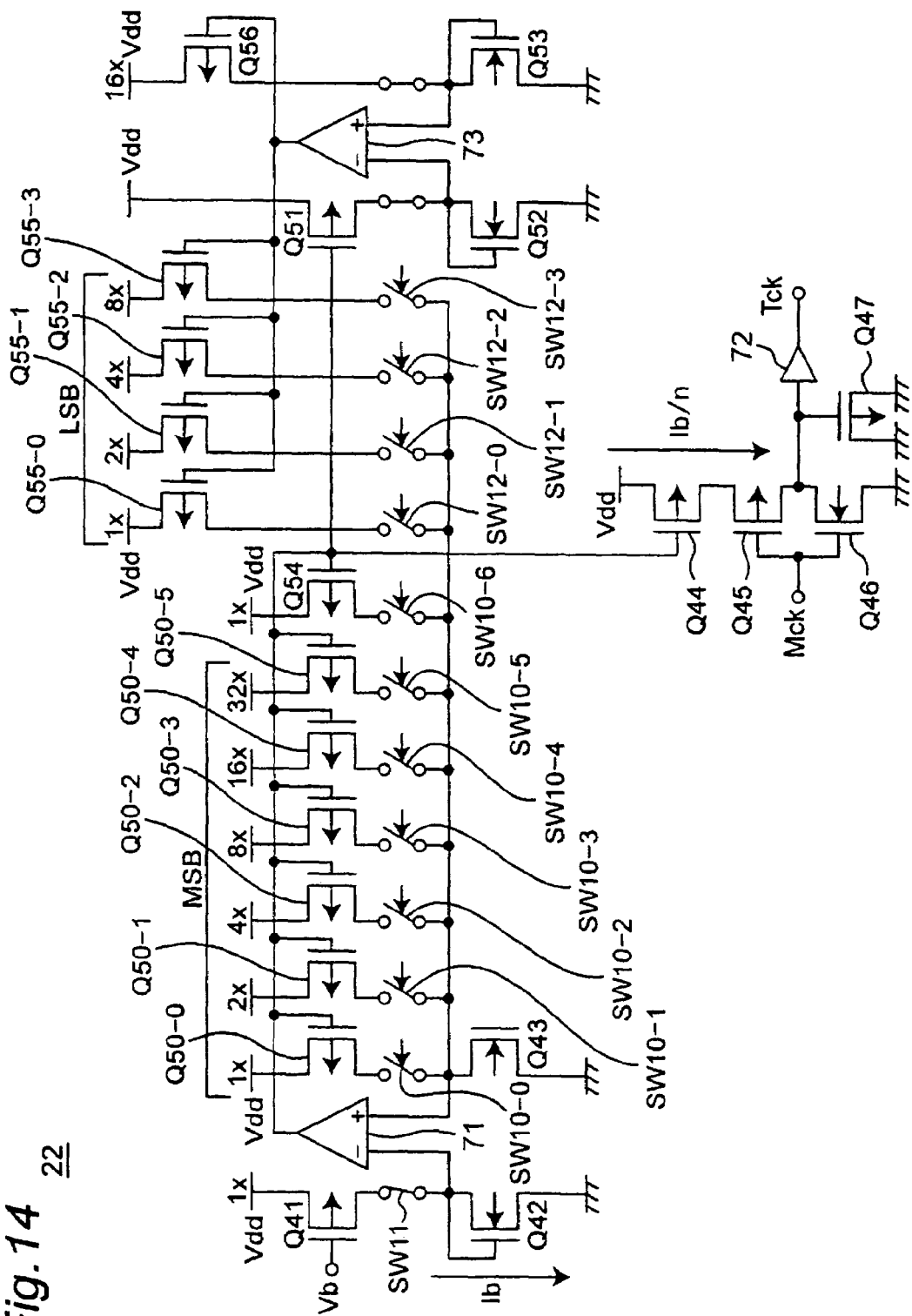
FIG. 14 is a circuit diagram showing a detailed configuration of the 10-bit variable step delay signal generator circuit 22 shown in FIG. 13.
Figure 15:
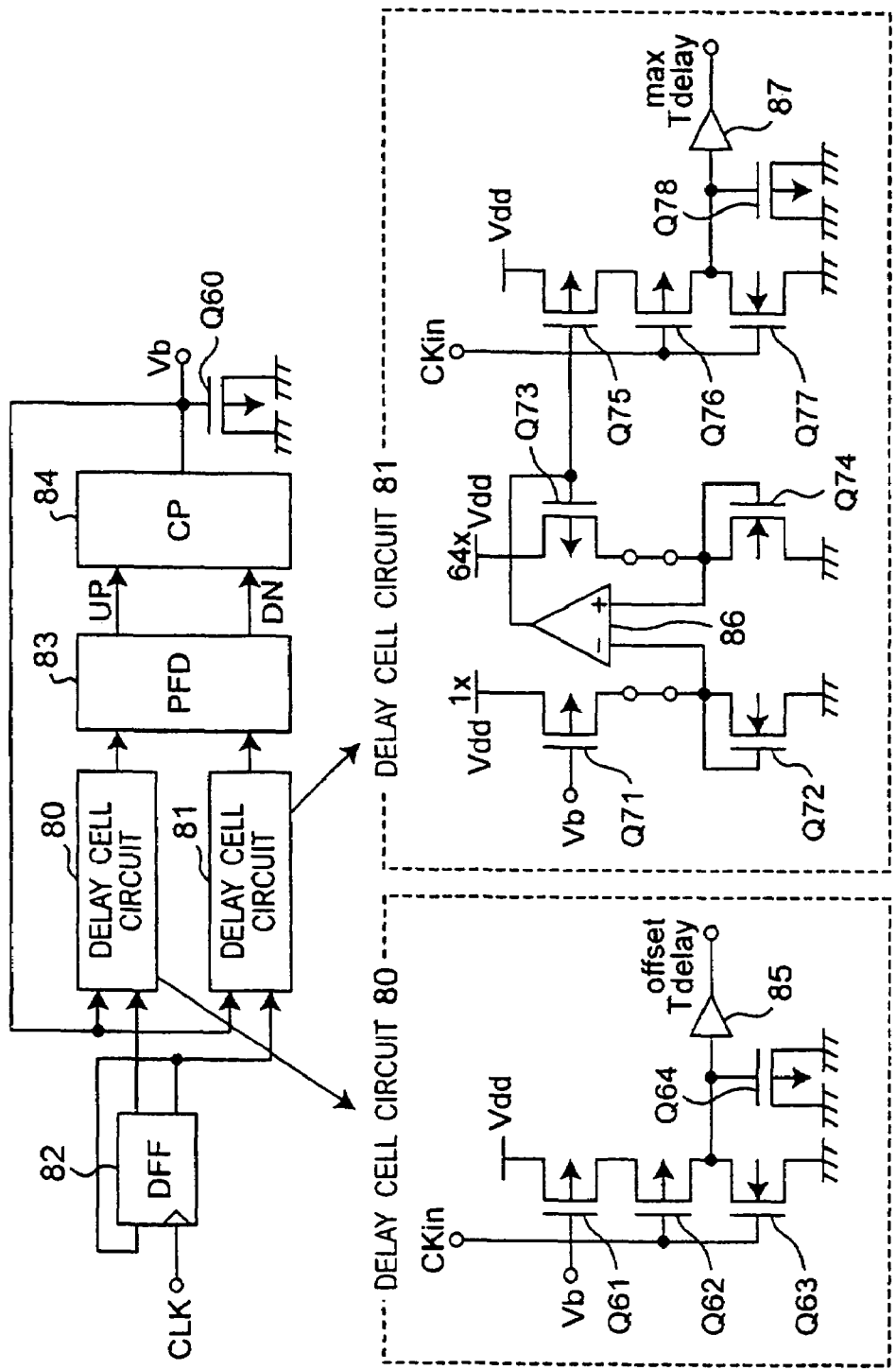
FIG. 15 is a block diagram and a circuit diagram showing the replica LDD circuit 21 shown in FIG. 1.

FIG. 14 is a circuit diagram showing a detailed configuration of the 10-bit variable step delay signal generator circuit 22 shown in FIG. 13. FIG. 15 is a block diagram and a circuit diagram showing the replica DLL circuit 21 shown in FIG. 1.

The replica DLL circuit 21 shown in FIG. 15 is configured to include the following components:

(a) a delay flip-flop 82 that operates based on a clock signal CLK;

(b) a delay cell circuit 80 that generates a signal corresponding to offset delay time $T_{delay}^{offset}$;

(c) a delay cell circuit 81 that generates a signal corresponding to maximum delay time $T_{delay}^{max}$;

(d) a phase and frequency detector 83 that detects a phase and a frequency based on the signals from the delay cell circuits 80 and 81, and that generates and outputs an up signal and a down signal for a phase control; and (e) a charge pump circuit 84 that generates the bias voltage Vb based on the phase control up signal and down signal from the phase and frequency detector 83.

In the variable step delay signal generator circuit 22 shown in FIGS. 13 and 14, a CMOS circuit consisting of two MOSFETs Q41 and Q42 generates the predetermined bias current Ib based on the bias voltage Vb from the replica DLL circuit 21, and applies a voltage by the bias current Ib to an inverting input terminal of a differential amplifier 71. An MSB 6-bit current divider circuit consisting of a plurality of P channel MOSFETs TQ50-0 to TQ50-5 and a plurality of switches SW 10-0 to SW10-5 divides the bias current Ib. An LSB 4-bit current divider circuit consisting of a plurality of P channel MOSFETs TQ55-0 to TQ55-3 and a plurality of switches SW 12-0 to SW 12-3 further divides the bias current Ib. Two differential amplifiers 71 and 73 are provided on both sides of the current divider circuits, respectively. Each of the two differential amplifiers 71 and 73 is a negative feedback circuit so that two input terminals (a non-inverting input terminal and an inverting input terminal) are equal in voltage value. In this circuit 22, in order to generate a current Ib/n which is obtained by multiplying the reference current Ib by (1/n) where "n" is a natural number, and which has 10-bit resolution, (where "n" is preferably a natural number equal to or larger than one if the digital processing is executed as described in the first preferred embodiment but may be a number equal to or larger than one such as 1.5, 2.6 or the like), the differential amplifier 71 generates a bias voltage corresponding to the MSB-side six bits, and the differential amplifier 73 adjusts the bias voltage corresponding to the LSB-side four bits. The delay signal generator circuit 22 generates the bias current Ib/n thus divided, and generates and outputs the enable timing control signal Tck based on the bias current Ib/n using the other circuits.

In other words, the variable step delay signal generator circuit 22 is a current mode circuit and divides the MSB six-bit delay step (corresponding to the delay time) by LSB four bits. The actual maximum delay time $T_{delay}(=2^{10})$ is defined as time obtained by subtracting the offset delay time $T_{delay}^{offset}$ from the maximum delay time $T_{delay}^{max}$ of the MSB six bits shown in FIG. 14. This delay time is adjusted by the bias voltage generated from the replica DLL circuit 21 so as to be equal to a clock cycle or period of the system clock signal Sck. Accordingly, the bias voltage Vb from the replica DLL circuit 21 is normalized by the system clock signal Sck. In addition, the sampling timing signal generator 20 can generate the enable timing control signal Tck based on the system clock signal Sck of the device under test (DUT) and including the enable timing signals indicating the synchronized sampling timings.

The sampling timing signal generator circuit 20 including the variable step delay signal generator circuit 22 thus configured has smaller operation noises and is suitable for the on-chip signal waveform monitoring apparatus for the following reasons. The number of times of signal transition required for generating the enable sampling timing control signal Tck including the enable timing signals that represent the sampling timings from the master clock signal Mck is only one. In addition, the replica DLL circuit 21 has only two signal transitions for every phase adjustment. Therefore, the noise in operation is small and suitable for the on-chip signal waveform monitoring apparatus 102.

Figure 16:
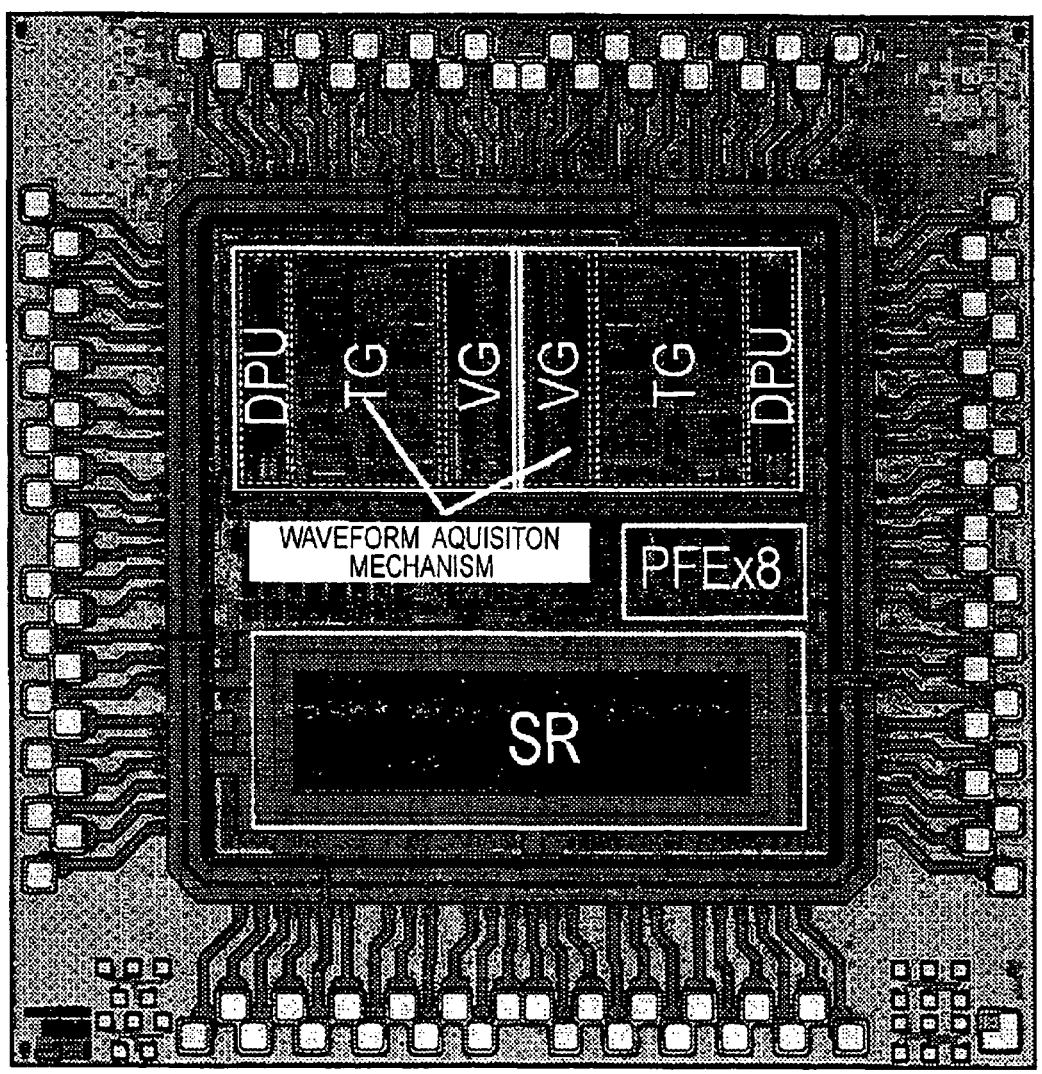
FIG. 16 is a photograph of a plan view showing a prototype LSI chip according to an implemental example of the on-chip signal waveform monitoring apparatus 102 according to the first preferred embodiment.

Next, an implemental example of the prototype system for evaluation will be described hereinafter. FIG. 16 is a photograph of a plan view showing a prototype LSI chip according to the implemental example of the on-chip signal waveform monitoring apparatus 102 according to the first preferred embodiment. An LSI chip was prototyped using a 0.18-μm CMOS process.

Referring to FIG. 16, a 24-bit shift register 8SR), which is a device under test (DUT), a signal waveform acquisition kernel circuit 90 (which is denoted by "waveform acquisition mechanism" in the photograph of FIG. 16), eight signal probing front-end circuits 30, and a signal waveform acquisition kernel circuit 90 for an evaluation are mounted on the prototype LSI chip. The signal waveform acquisition kernel circuit 90 has an area of 700 μm×600 μm, one signal probing front-end circuit 30 has an area of 60 μm×200 μm, and the LSI chip has a size of 2.8 mm×2.8 mm. By designing each of the signal waveform acquisition kernel circuits 90 and the signal probing front-end circuits 30 using input and output MOSFETs having a power source voltage of 2.5 V and employing a deep N-well semiconductor substrate, a substrate crosstalk is reduced. The shift register serving as the device under-test (DUT) is designed using ordinary CMOS devices having a power source voltage of 1.8 V.

Figure 17:
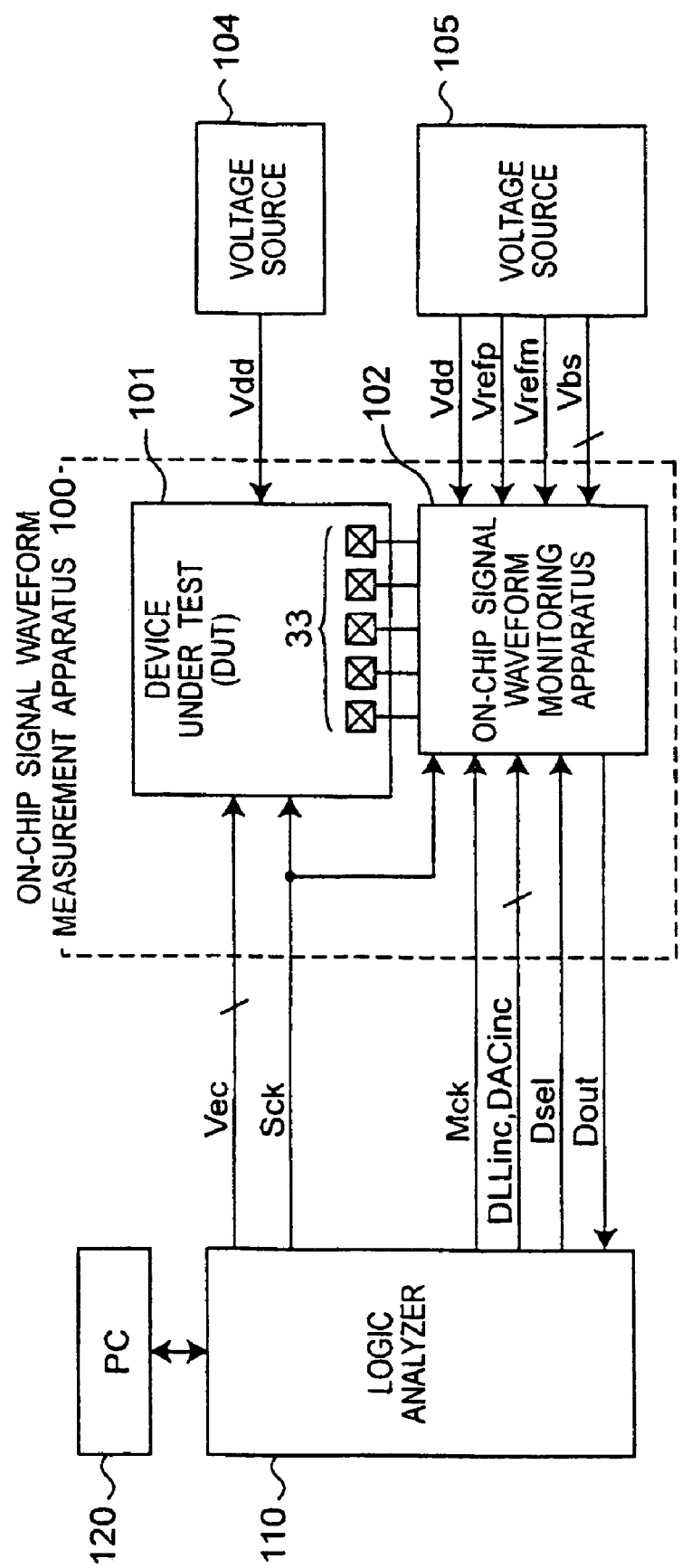
FIG. 17 is a block diagram showing a configuration of a signal waveform measurement system, that includes the on-chip signal waveform monitoring apparatus 102 shown in FIG. 1 according to the first preferred embodiment.

A measurement result of the present implemental example will next be described. FIG. 17 is a block diagram showing a configuration of a signal waveform measurement system that includes the on-chip signal waveform monitoring apparatus 102 shown in FIG. 1 according to the first preferred embodiment. The signal waveform measurement system is configured to include a logic analyzer 110 (LA) capable of controlling a PC 120 through a TCP/IP interface, a power source voltage supply power source 104, a bias voltage supply voltage source 105, and an on-chip signal waveform measurement apparatus 100. The on-chip signal waveform measurement apparatus 100 includes a device under test (DUT) 101 and the on-chip signal waveform monitoring apparatus 102. The logic analyzer 110 generates test vector data Vec and outputs the data Vec to the device under test (DUT) 101, which is, for example, a shift register. In addition, the logic analyzer 110 generates the system clock signal Sck, and the generated system clock signal Sck is inputted to the device under test (DUT) 101 and the on-chip signal waveform monitoring apparatus 102. The logic analyzer 110 also generates the master clock signal Mck, and outputs the master clock signal Mck to the on-chip signal waveform monitoring apparatus 102. In addition, the logic analyzer 110 outputs a DLL increment signal to the sampling timing signal generator 20 of the on-chip signal waveform monitoring apparatus 102. Further, the logic analyzer 110 outputs a DA converter increment signal to the reference voltage generator 10 of the on-chip signal waveform monitoring apparatus 102. The logic analyzer 110 executes the processing for output signals outputted from the on-chip signal waveform monitoring apparatus 102 in response to these signals.

Figure 18:
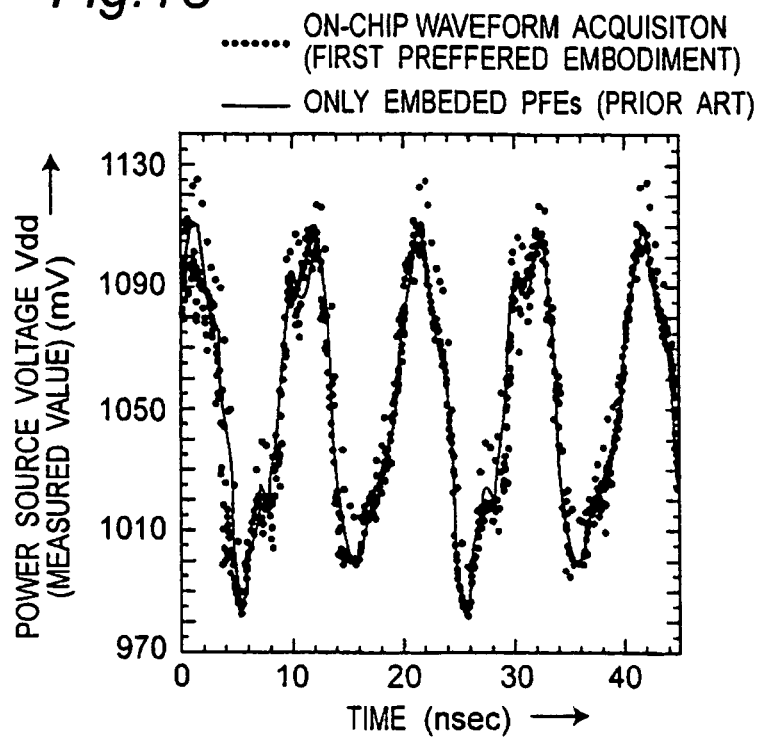
FIG. 18 is a graph showing a power source voltage (measured value) in the signal waveform monitoring apparatus (only embedded PFEs) according to the prior art, and a power source voltage (measured value) in the on-chip signal waveform monitoring apparatus 102 according to the first preferred embodiment.
Figure 19:
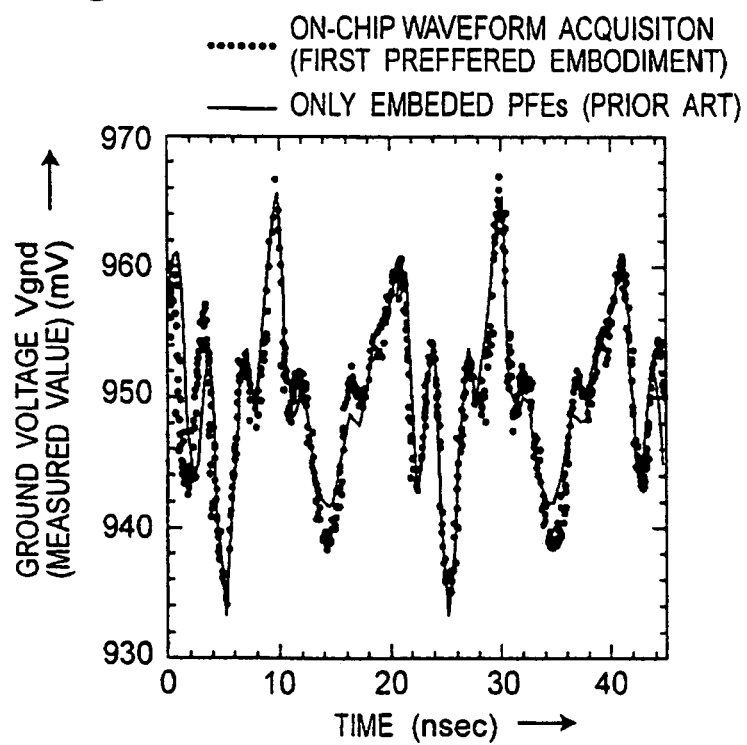
FIG. 19 is a graph showing a ground voltage (measured value) in the signal waveform monitoring apparatus (only the embedded PFEs) according to the prior art, and a ground voltage (measured value) in the on-chip signal waveform monitoring apparatus 102 according to the first preferred embodiment.

FIG. 18 is a graph showing a power source voltage Vdd (measured value) in the signal waveform monitoring apparatus (only embedded PFEs) according to the prior art, and a power source voltage Vdd (measured value) in the on-chip signal waveform monitoring apparatus 102 according to the first preferred embodiment. FIG. 19 is a graph showing a ground voltage Vgnd (measured value) in the signal waveform monitoring apparatus (only the embedded PFEs) according to the prior art, and a ground voltage Vgnd (measured value) in the on-chip signal waveform monitoring apparatus 102 according to the first preferred embodiment. In other words, FIGS. 18 and 19 show potential changes of the power source voltage Vdd and the ground voltage Vgnd, respectively, when the shift register, which is the device under test (DUT) 101, is allowed to operate using the system clock signal Sck at 100 MHz. In each of FIGS. 18 and 19, two waveforms are shown, and one of the two waveforms is obtained by allowing the on-chip signal waveform monitoring apparatus 102 to generate signals required for the measurement on the LSI chip. At this time; the 10-bit variable step signal generator circuit 22 allows the replica DLL circuit 21 that generates the control bias voltage Vb so as to be in synchronization with a clock signal at 25 MHz obtained by dividing the system clock signal Sck by four. In this case, the circuit 22 generates delay time (delay step) of about 40 picoseconds. The 10-bit R2-R ladder circuit 60 of FIG. 11 generates the reference voltage signal Vref of ±100 mV centering around a DC shift output voltage of the source follower circuit, i.e., a voltage step of about 200 µV based on the reference plus voltage Vrefp and the reference minus voltage Vrefm. The other waveform is obtained by an off-chip measurement according to the prior art for generating a timing signal and a reference voltage signal equal in resolution to each other using an external apparatus. In each of the present preferred embodiment and the prior art, the measurement target signals are detected using the same signal probing front-end circuits 30. FIGS. 18 and 19 show that measured waveforms are substantially coincident between the on-chip signal generation and the off-chip signal generation, and that the proposed on-chip signal waveform monitoring apparatus 102 can realize a signal waveform acquisition processing with a higher precision.

Figure 20:
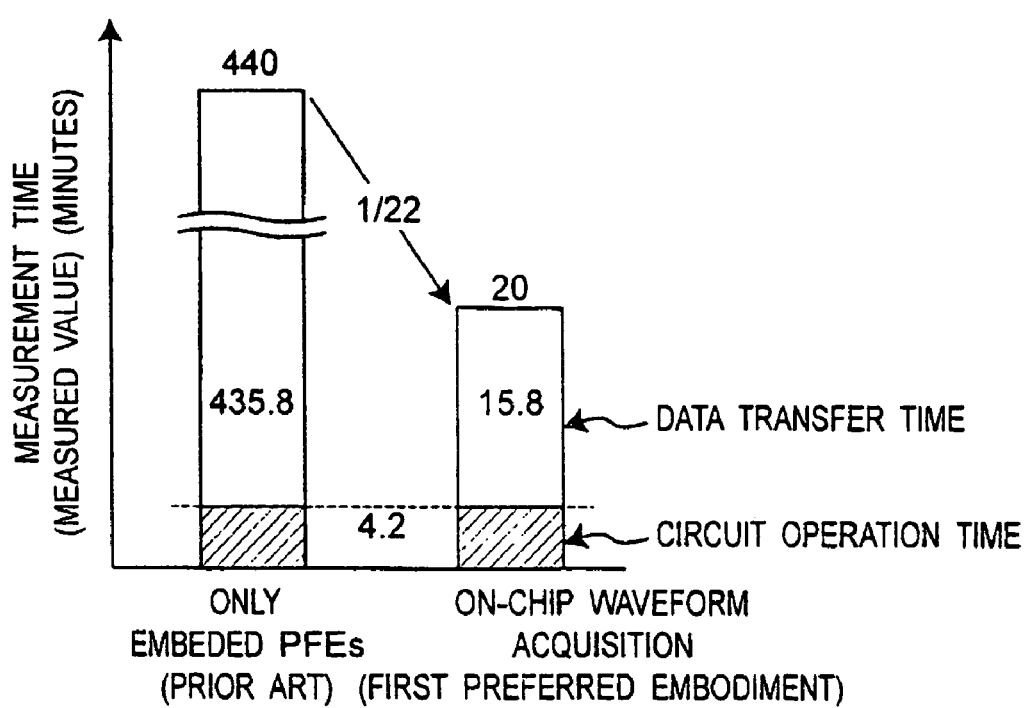
FIG. 20 is a graph showing measurement times (measured value) for signal waveform acquisition, where the measurement times includes a time is required by the signal waveform monitoring apparatus (only the embedded PFEs) according to the prior art, and a time required by the on-chip signal waveform monitoring apparatus 102 according to the first preferred embodiment.

FIG. 20 is a graph showing measurement times (measured value) for signal waveform acquisition, where the measurement times includes a measurement time required by the signal waveform monitoring apparatus (only the embedded PFEs) according to the prior art, and a further measurement time required by the on-chip signal waveform monitoring apparatus 102 according to the first preferred embodiment. FIG. 20 shows the measurement time required when signal waveforms of samples at 1024 points are measured by the on-chip signal waveform monitoring apparatus 102 according to the present preferred embodiment, and the measurement time when the external measurement unit is off-chip controlled by the binary search algorithm according to the prior art. The measurement system using the logic analyzer 110 needs the time for transferring data from the logic analyzer 110 to the personal computer 120 in addition to the measurement time shown in FIG. 7. Therefore, the measurement time increases. On the other hand, the proposed on-chip signal waveform monitoring apparatus 102 according to the present preferred embodiment can realize remarkable reduction in the measurement time by 95% of the measurement time according to the prior art.

Figure 21A:
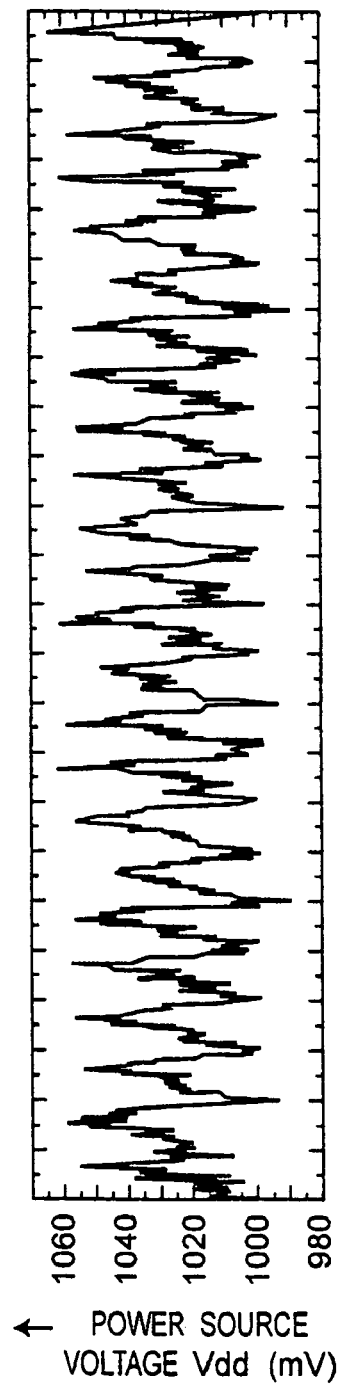
FIG. 21A is a graph showing a power source voltage (measured value) in the on-chip signal waveform monitoring apparatus 102 according to the first preferred embodiment.
Figure 21B:
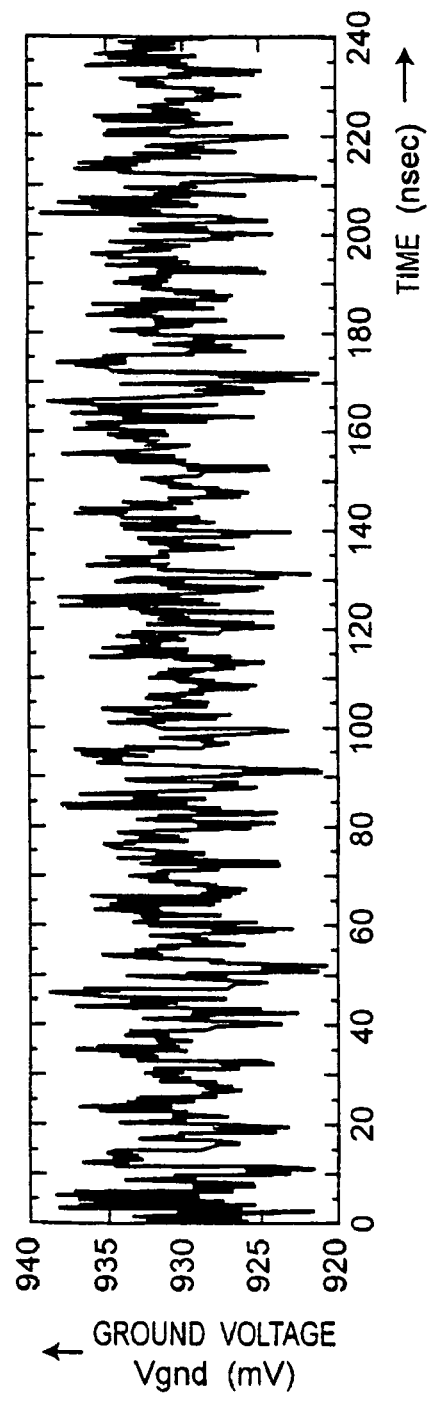
FIG. 21B is a graph showing a ground voltage (measured value) in the on-chip signal waveform monitoring apparatus 102 according to the first preferred embodiment.

FIG. 21A is a graph showing a power source voltage (measured value) in the on-chip signal waveform monitoring apparatus 102 according to the first preferred embodiment. FIG. 21B is a graph showing a ground voltage (measured value) in the on-chip signal waveform monitoring apparatus 102 according to the first preferred embodiment. In other words, FIGS. 21A and 21B show measurement results of executing a signal waveform acquisition processing for the power source voltage and the ground voltage for a long period of time. In the measurement, the master clock signal Mck is shifted by as much as 40 nanoseconds whenever a 10-bit delay step is generated over 24 cycles of the system clock signal Sck, and signal waveforms are detected at 6144 data points in all. An on-chip signal waveform acquisition processing at this number of data points can be executed for a realistic measurement time only when the signals required for the measurement are generated on the LSI chip. In this case, a data pattern of four bits of "0011" is repeatedly applied to the shift register, which is the device under test (DUT) 101, so that it can be confirmed that a measured signal waveform has a periodic pattern of four clock cycles.

As described so far, the proposed multi-channel on-chip signal waveform monitoring apparatus 102 according to the present example embodiment realizes on-chip signal monitoring having various attributes on the mixed signal LSI. The measurement system designed and prototyped by the 0.18-µm CMOS process according to the implemental example operates in synchronization with the measurement target digital circuit that operates at 100 MHz, can perform the measurement of multi-channel signal waveforms each having a resolution of 40 picoseconds and 200 µV. It is confirmed that the apparatus 102 can obtain the measurement waveforms having substantially the same waveform precision as those according to the off-chip measurement technique using the external measurement unit. Further, the apparatus 102 can reduce the measurement time by 95% of the measurement time required by the off-chip measurement. The technique according to the first example embodiment is a technique on components required for diagnosis of a digital/analog mixed signal LSI, has advantageous effects in waveform precision, in area efficiency, and in the measurement cost, and further can execute the evaluation of the mixed signal LSI in a digital test environment.

Second Preferred Embodiment

Figure 22:
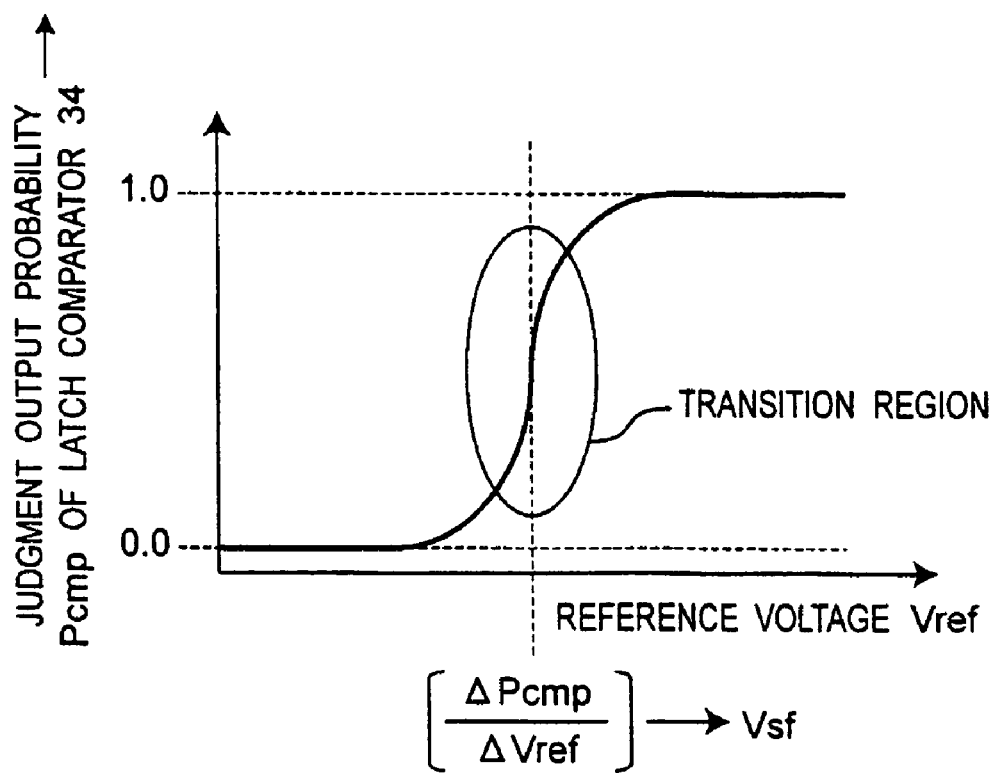
FIG. 22 is a graph showing a judgment output probability Pcmp of a latch comparator 34 relative to a reference voltage Vref used in a signal waveform measurement system according to a second example embodiment.
Figure 23:
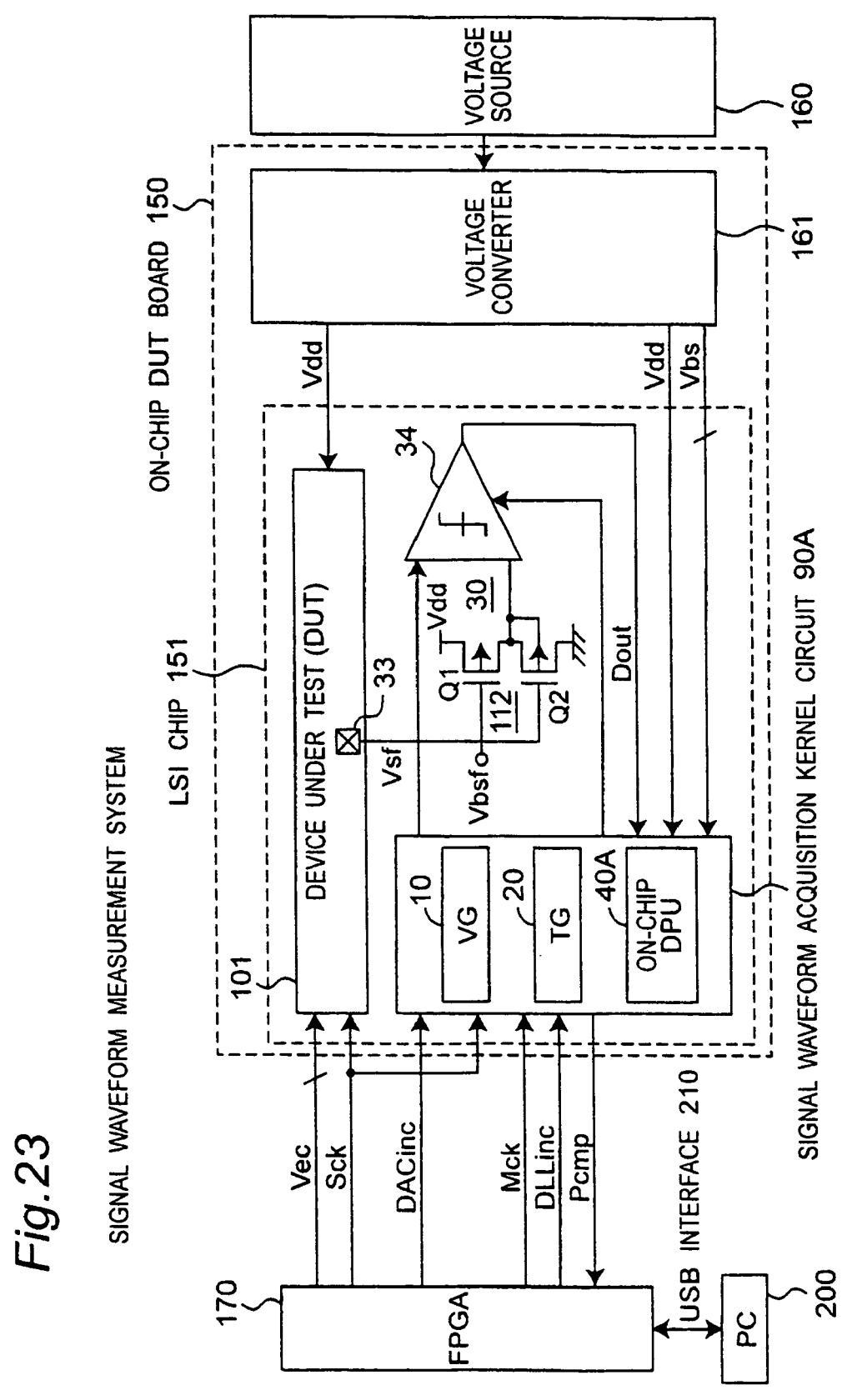
Figure 24:
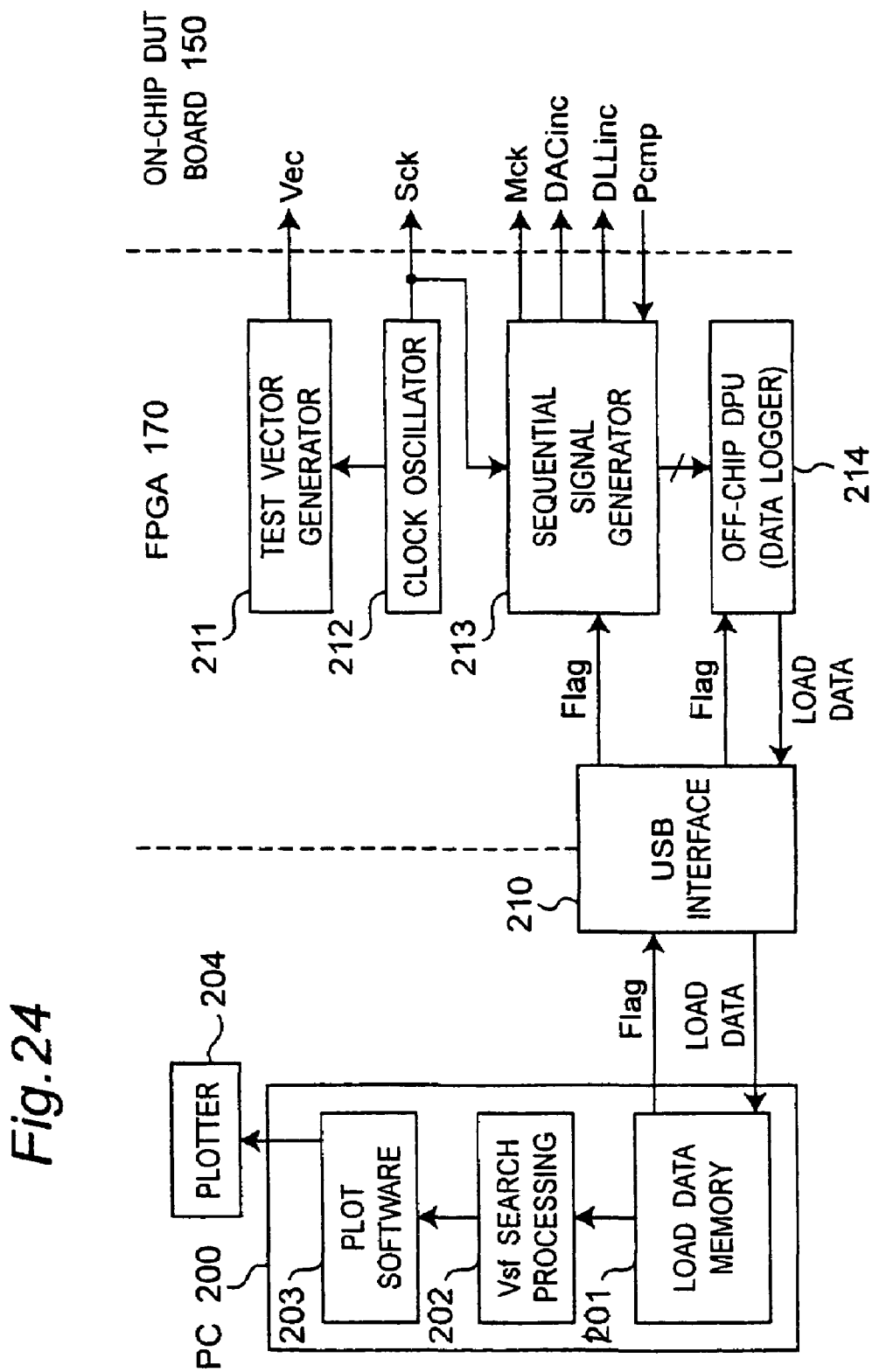
FIG. 24 is a block diagram showing a detailed configuration of a personal computer 200 and an FPGA 170 shown in FIG. 23.

FIG. 22 is a graph showing a judgment output probability Pcmp of a latch comparator 34 relative to a reference voltage Vref used in a signal waveform measurement system according to a second preferred embodiment of the present invention. FIG. 23 is a block diagram showing a configuration of the signal waveform measurement system according to the second preferred embodiment of the present invention. FIG. 24 is a block diagram showing a detailed configuration of a personal computer 200 and an FPGA 170 shown in FIG. 23.

The signal waveform measurement system according to the second preferred embodiment is characterized by sharing the functions of the data processing unit 40 according to the first preferred embodiment shown in FIG. 1 between an on-chip DPU 40A on an LSI chip and an off-chip DPU 214 of an FPGA 170 different from the LSI chip. In other words, the second preferred embodiment is characterized as follows. Functions of a decision processing for deciding the detected voltage Vsf from the judgment output probability Pcmp-to-reference voltage Vref characteristic curve of FIG. 5 of the latch comparator 34 in each of the signal probing front-end circuits 30 shown in FIG. 1 are shared between the on-chip DPU 40A and the off-chip DPU 214 so as to realize this decision processing compact.

Referring to FIG. 23, an on-chip DPU board 150 is configured to include an LSI chip 151, and a voltage converter 161 that converts a power source voltage from a voltage source 160 into a predetermined power source voltage Vdd and a predetermined bias voltage Vbs, and that supplies the power source voltage Vdd and the bias voltage Vbs to the LSI chip 151. The LSI chip 151 includes a device under test (DUT) 101, a plurality of signal probing front-end circuits 30, and a signal waveform acquisition kernel circuit 90A. The signal waveform acquisition kernel circuit 90A includes a reference voltage generator 10, a sampling timing signal generator 20, and the on-chip DPU 40A to be described later in detail.

Referring to FIG. 24, the FPGA 170 is configured to include the following components:

(a) a clock oscillator 212 that generates a system clock signal Sck;

(b) a test vector generator 211 that generates test vector data Vec based on the system clock signal Sck from the clock oscillator 212, and outputs the test vector data Vec to the on-chip DUT board 150;

(c) a sequential signal generator 213 that generates various signals Mck, DACinc, and DLLinc based on the system clock signal Sck from the clock oscillator 212, a flag Flag from the personal computer 200, and the judgment output probability Pcmp, and outputs the processed judgment output probability Pcmp to the off-chip DPU (data logger) 214; and (d) the off-chip DPU (data logger) 214 that executes a predetermined processing for the judgment output probability Pcmp from the sequential signal generator 213 based on the flag Flag from the personal computer 200, and then, outputs the processed judgment output probability Pcmp to the personal computer 200.

The FPGA 170 and the personal computer 200 transmit and receive various signals to and from each other using a USB interface 210. Load data, which is the processed judgment output probability Pcmp from the off-chip DPU 214, is outputted to and stored in a load data memory 210 of the personal computer 200 via the USB interface 210. The personal computer 200 executes a predetermined detected voltage Vsf search processing 202 based on the load data stored in the load memory 201, and outputs a result of the processing 202 to a plotter 204 using plot software 203.

In the first preferred embodiment, the reference voltage Vref that satisfies $(\Delta Pcmp/\Delta Vref)max$ is obtained as an approximate value (a read value) of the detected voltage Vsf, as shown in the characteristic curve of FIG. 5, according to the reference voltage Vref loop processing in the signal waveform acquisition processing shown in FIG. 4. FIG. 22 shows a characteristic curve of the judgment output probability Pcmp relative to the reference voltage Vref (when the comparator 34 outputs "one") while the input voltage (detected voltage) Vsf of the latch comparator 34 is constant. This characteristic curve shows universal features of ordinary comparator circuits. In the present preferred embodiment according to the present invention, the following two features are used.

(Feature A) The judgment output probability Pcmp is invariable or constant when the detected voltage Vsf and the reference voltage Vref are constant.

(Feature B) If the detected voltage Vsf is constant and the reference voltage Vref is uni-directionally incremented from the minimum voltage toward the maximum voltage, the judgment output probability Pcmp is changed from zero to one via the "transition region". However, in regions other than the transition region, the value of the judgment output probability Pcmp is not changed according to a change of the reference voltage Vref.

Figure 25:
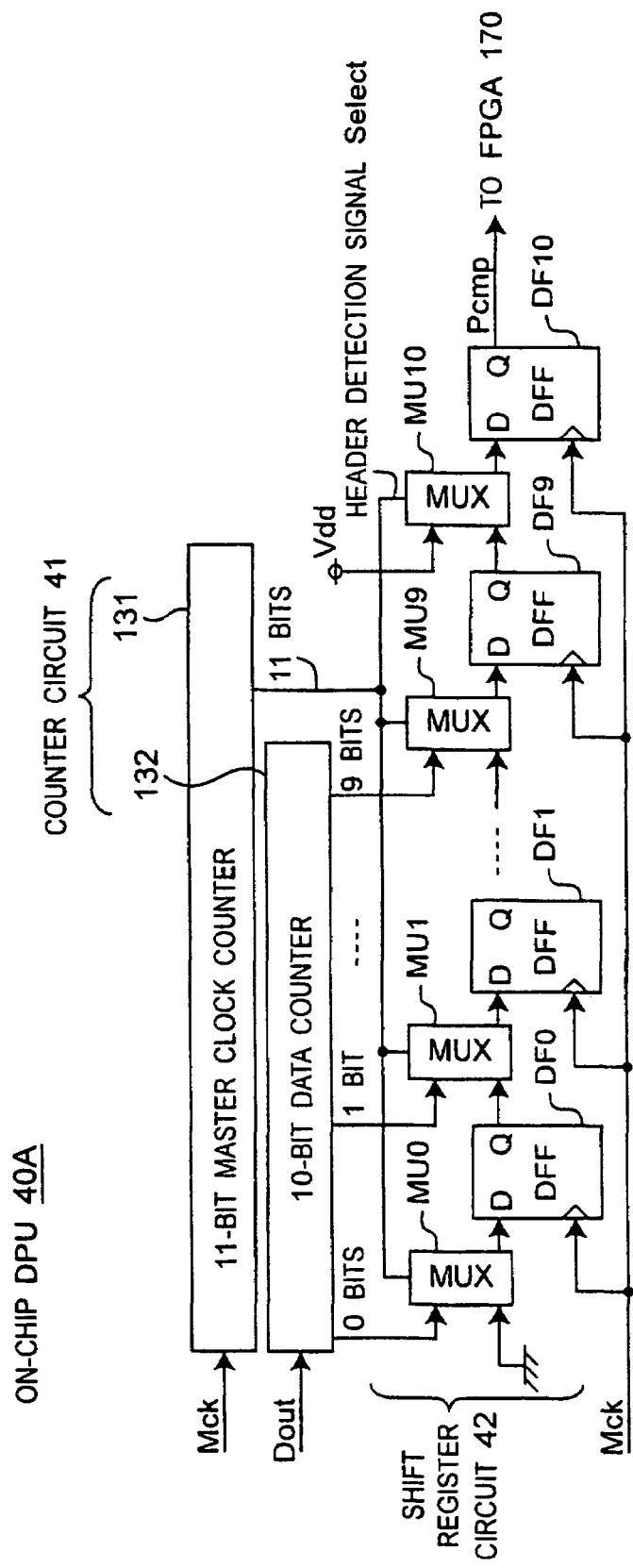
FIG. 25 is a block diagram showing a configuration of an on-chip DPU 40A shown in FIG. 23.
Figure 26:
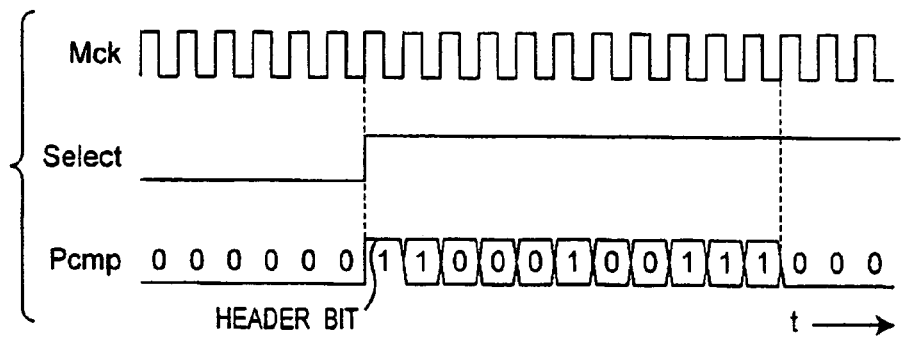
FIG. 26 is a timing chart showing an operation of the on-chip DPU 40A shown in FIG. 25.

The feature A shows that if the detected voltage Vsf and the reference voltage Vref are constant and the latch comparator 34 continues to perform a comparison operation at clock cycle's intervals, the judgment output probability Pcmp may be calculated from a result of adding output values in an interval of an arbitrary number of clocks. FIG. 25 is a block diagram showing a configuration of the on-chip DPU 40A shown in FIG. 23. FIG. 26 is a timing chart showing an operation of the on-chip DPU 40A shown in FIG. 25. Based on this idea, the on-chip DPU 40A shown in FIG. 25 continuously executes the following operation steps.

(Step SS1) The on-chip DPU 40A calculates the judgment output probability Pcmp by counting the number of times of output "one" from the signal probing front-end circuit 30 for each of 1204 comparison processings of the comparator 34 in synchronization with the master clock signal Mck.

(Step SS2) As shown in FIG. 26, the on-chip DPU 40A adds "one" indicating one bit as a header bit to a top of serial data, and outputs a signal of the judgment output probability as serial data of a total of eleven bits.

(Step SS3) As shown in FIG. 26, the on-chip DPU 40A continuously outputs "zero" subsequent to the step SS2, and initializes the on-chip DPU 40A. In other words, if the detected voltage Vsf and the reference voltage Vref are both constant, the on-chip DPU 40A continues to output a constant judgment output probability Pcmp.

Figure 27:
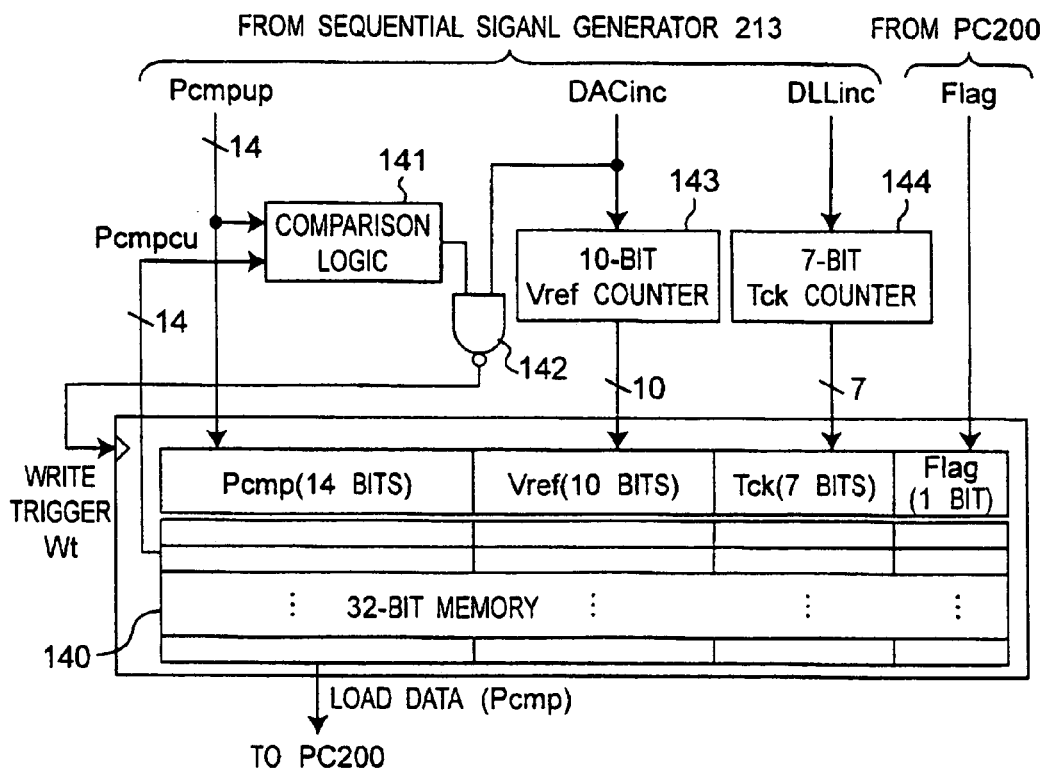
FIG. 27 is a block diagram showing a configuration of an off-chip DPU 302 shown in FIG. 24.
Figure 28:
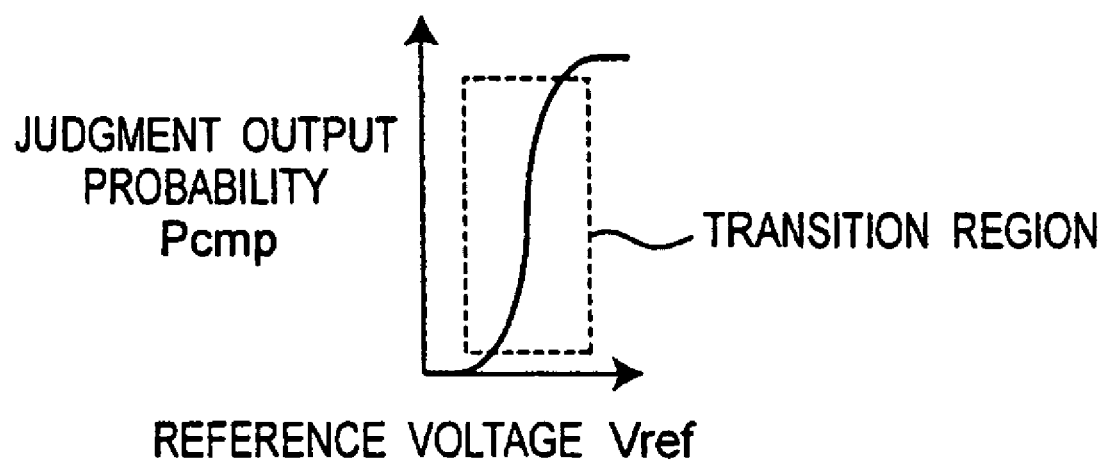
FIG. 28 is a graph showing characteristics of a digital output signal Pcmp relative to the reference voltage Vref, where the characteristics are stored in a 32-bit memory shown in FIG. 27.

Referring to FIG. 27, the off-chip DPU 214 is configured to include a 32-bit memory 140 serving as a Pcmp data memory, a comparison logic 141, a NAND gate 142, a 10-bit Vrf counter 143, and a 7-bit Tck counter 144. The feature B shows the following. If the off-chip DPU 214 stores the judgment output probability Pcmp in the 32-bit memory 140 serving as the Pcmp data memory only if the judgment output probability Pcmp after the reference voltage Vref is incremented is changed from the judgment output probability before the increment, data on the judgment output probability Pcmp only in the transition region shown in FIG. 22 can be held. Based on this idea, in the off-chip DPU 214 shown in FIG. 27, the up-to-data Pcmpup on the judgment output probability Pcmp from the on-chip DPU 40A (concretely, the up-to-data Pcmpup is specifically inputted from the on-chip DPU 40A via a 30-bit shift register 231 (See FIG. 29) of a signal generator 230 of the sequential signal generator 213) is compared with up-to-date data Pcmpcu as stored in the 32-bit memory 140 by the NAND gate 142. Only when the data Pcmpup is different from the data Pcmpcu, the data Pcmpup is stored in the 32-bit memory 140 as up-to-date data Pcmp. By performing this processing for all the steps of the reference voltage Vref incremented uni-directionally, only the data on the judgment output probability Pcm in the transition region of the comparator 34 shown in FIG. 28 is stored in the 32-bit memory 140.

The on-chip DPU 40A shown in FIG. 25 is configured to include the following components:

(a) a counter circuit 41 that includes an 11-bit master clock counter 131 and a 10-bit data counter 132; and (b) a shift register circuit 42 that includes eleven multiplexers MU0 to MU10 and eleven delay flip-flops DF0 to DF10.

The 11-bit mater clock counter 131 counts master clock signals Mck. In addition, as shown in FIG. 16, the counter 131 detects a header bit representing the first rising of "one", generates a header detection signal Select, and outputs the signal Select. The 10-bit data counter 132 counts digital output signals Dout, and outputs serial data on ten bits or 0-th to ninth bits of the judgment output probability Pcmp after the header bit to the sequential signal generator 213 of the FPGA 170. In other words, the on-chip DPU 40A continues to output the judgment output probability Pcmp by the 1024 comparison operations performed by the comparator 34 based on the feature A. A header bit "one" is added to a top of an output data sequence, and continuous bits of "zero" are arranged after the 10-bit output data sequence. That is, the on-chip DPU 40A includes a mechanism for detecting the header bit from the data sequence of the judgment output probability Pcmp and for acquiring effective 10-bit data.

As described above, the on-chip DPU 40A based on the feature A shown in FIG. 25 can be configured to include only the two counters 131 and 132, the ten multiplexers MU0 to MU10, and the ten delay flip-flops DF0 to DF10. Since it is unnecessary to mount, in particular, the data memory 140 mounted on the LSI chip, the circuit scale can be made smaller than that of the prior art.

Figure 29:
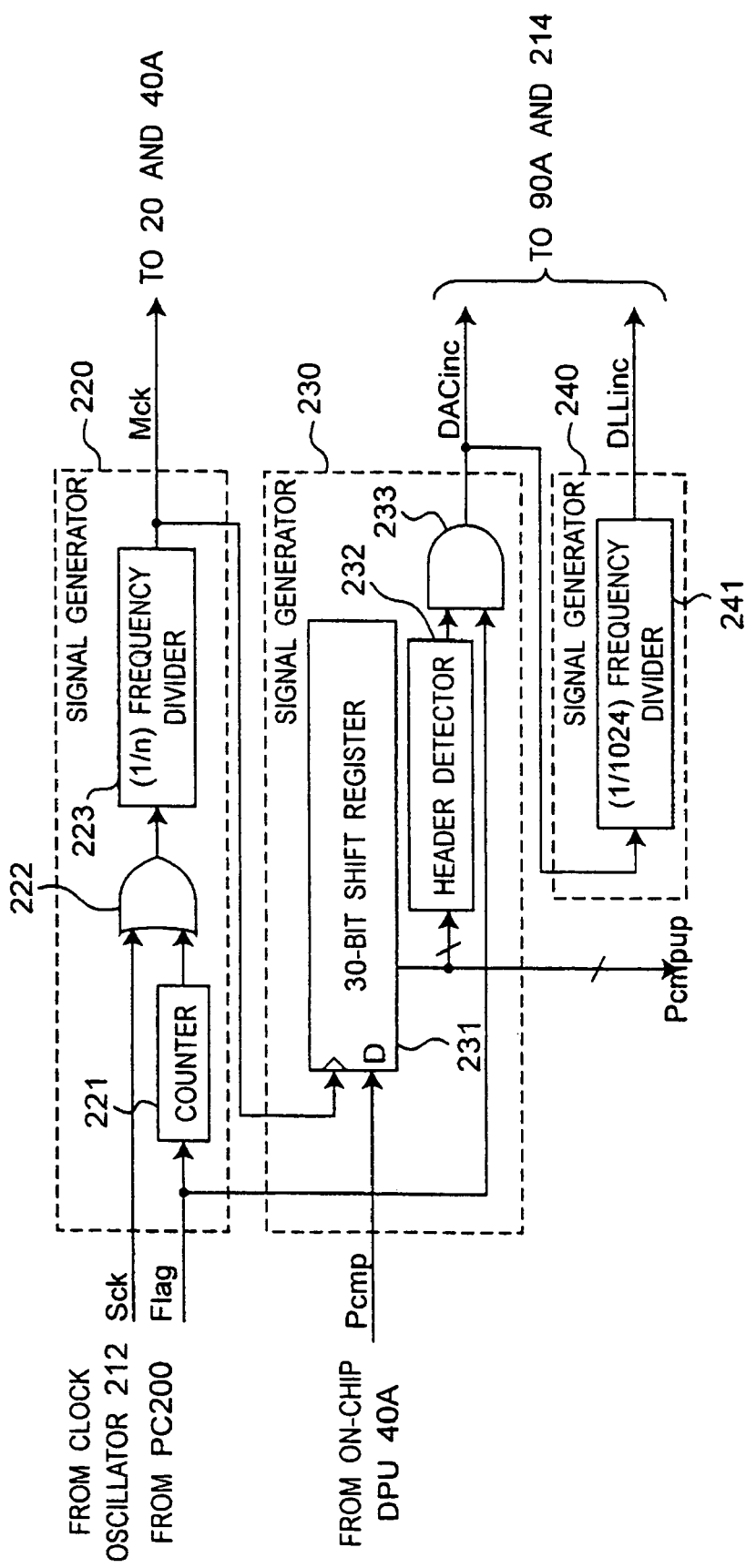
FIG. 29 is a block diagram showing a configuration of a sequential signal generator 213 shown in FIG. 24.

FIG. 29 is a block diagram showing a configuration of the sequential signal generator 213 shown in FIG. 24. Referring to FIG. 29, the sequential signal generator 213 is configured to include three signal generators 220, 230, and 240. The signal generator 220 includes a counter 221, an OR gate 222, and a (1/n) frequency divider 223. The signal generator 220 generates the master clock signal Mck based on the system clock Sck and the flag Flag, and outputs the signal Mck to the signal generator 230, the sampling timing signal generator 20, and the on-chip DPU 40A. The signal generator 230 includes a 30-bit shift register 231, a header detector 232, and an AND gate 233. The signal generator 230 outputs the up-to-date data Pcmpup on the judgment output probability Pcm to the off-chip DPU 214 based on the master clock signal Mck, the flag Flag, and the judgment output probability Pcm. In addition, the signal generator 230 generates the reference voltage increment signal DACinc and outputs the signal DACinc to the signal waveform acquisition kernel circuit 90A and the off-chip DPU 214. The signal generator 240 includes a (1/1024) frequency divider 241, and divides the reference signal increment signal DACinc by 1024, and as a result, generating and outputting a timing increment signal DLLinc to the signal waveform acquisition kernel circuit 90A and the off-chip DPU 214.

The off-chip DPU 214 (FIG. 27) having the feature B can be configured to include the logic circuit and the memory, and mounted on the commercially available FPGA (reconfigurable gate array) 170 together with the sequential signal generator 213 or the like that generates various digital signals required for controlling the waveform measurement. The signal waveform measurement system according to the present preferred embodiment consists of the on-chip DUT board 150, the FPGA 170, the voltage source 160, and the personal computer 200. As compared with the system that realizes equivalent functions using the logic analyzer as shown in FIG. 17, the system becomes lower in cost and compact.

Figure 30:
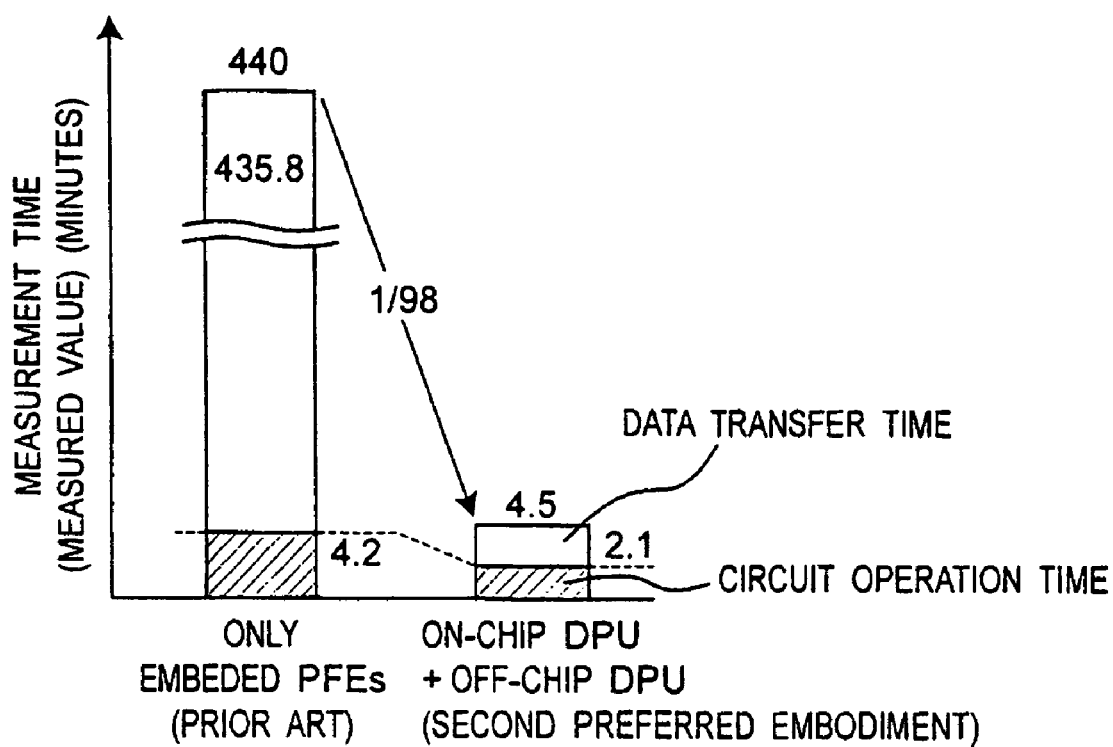
FIG. 30 is a graph showing measurement times (measured value) for signal waveform acquisition, where the measurement times includes a time required by the signal waveform monitoring apparatus (only embedded PFEs) according to the prior art, and a time required by the signal waveform measurement system shown in FIG. 27 according to the second preferred embodiment.

FIG. 30 is a graph showing measurement times (measured value) for signal waveform acquisition, where the measurement times includes a measurement time required by the signal waveform monitoring apparatus (only embedded PFEs) according to the prior art, and a further measurement time required by the signal waveform measurement system shown in FIG. 27 according to the second preferred embodiment. In particular, FIG. 30 shows a measurement time reduction effect produced by the configuration of the second preferred embodiment. The measurement time can be reduced to about one-hundredth or less of the measurement time required by the configuration in which only the signal probing front-end circuits 30 are mounted. The measurement time can be reduced to a quarter or less of even the measurement time required as a result of the configuration of the first preferred embodiment using the logic analyzer of FIG. 20.

As a method of further reducing the measurement time and improving the measurement certainty according to the second preferred embodiment, a counting number Ncmp of comparison outputs of the comparator 34 by the on-chip DPU 40A may be made variable (that is, nonlinear) based on the characteristics of the feature B. For instance, the counting number Ncmp may be 256 in a region in which the judgment output probability is close to either 0.0 or 1.0, and the counting number Ncmp may be 2048 in the transition region. Then, the measurement time can be further remarkably reduced and more correct measurement can be realized.

Alternatively, as the method of reducing the measurement time and improving the measurement certainty, the on-chip DPU 40A may be configured so that the counter circuit 41 and the shift register 42 perform a pipeline operation.

Third Preferred Embodiment

Figure 31:
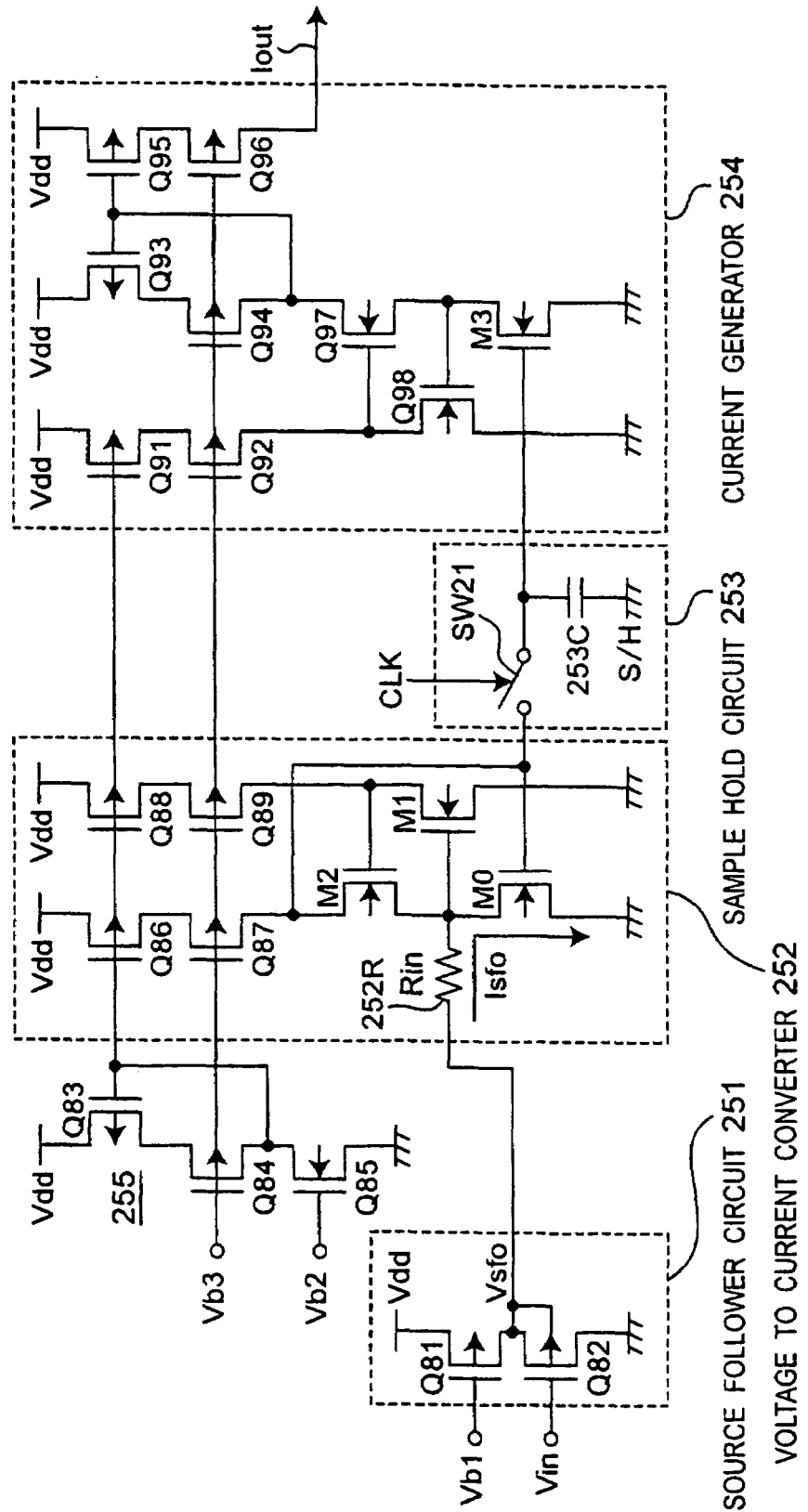
FIG. 31 is a circuit diagram showing a configuration of a signal probing front-end circuit 30A according to a third example embodiment.

FIG. 31 is a circuit diagram showing a configuration of a signal probing front-end circuit 30A according to a third example embodiment. Namely, FIG. 31 shows the configuration of the signal probing front-end circuit 30A that employs a current mode sample hold circuit 253. The signal probing front-end circuit 30A is configured to include the following components:

(a) a source follower circuit 251 that detects a measurement target voltage Vin;

(b) a voltage-to-current converter 252 that converts the detected voltage into a current;

(c) a current mode sample hold circuit 253 that holds the current converted from the detected voltage in a holding capacitor 253C via a switch SW 21, and outputs the held current; and (d) a current generator 254 that generates an output current Iout having a predetermined magnitude proportional and corresponding to the current outputted from the sample hold circuit 253 based on the current, and outputs the output current Iout.

The voltage-to-current converter 252, the sample hold circuit 253, and the current generator 254 will be generically referred to as a "current mode sample hold circuit".

Referring to FIG. 31, an output voltage Vsfo of the source follower circuit 251 is converted into a current Isfo based on a relational equation of Isfo=Vsfo/Rin, where Rin denotes a resistance value. During a sample operation, the current Isfo is applied to a MOSFET M0. During a hold operation, a gate voltage of the MOSFET M0 is held in the holding capacitor 253C. This gate voltage is converted into a current again in a MOSFET M3, and is outputted as an output current Iout through a current mirror circuit of the current generator 254. It is noted that if the MOSFETs M0 and M3 are equal in channel size ratio (=(gate width W)/(gate length L)), the output current Iout is equal to Isfo (Iout=Isfo). In FIG. 31, a current comparator (equivalent to a current comparator 34A shown in FIG. 33) is not shown in the signal probing front-end circuit 30A. In a manner similar to that of the voltage comparator 34, the current comparator compares the current generated by the current generator 254 with a reference current Iref converted from each reference voltage Vref, digitizes a comparison result into a binary digital output signal, and outputs the binary digital output signal.

Figure 32:
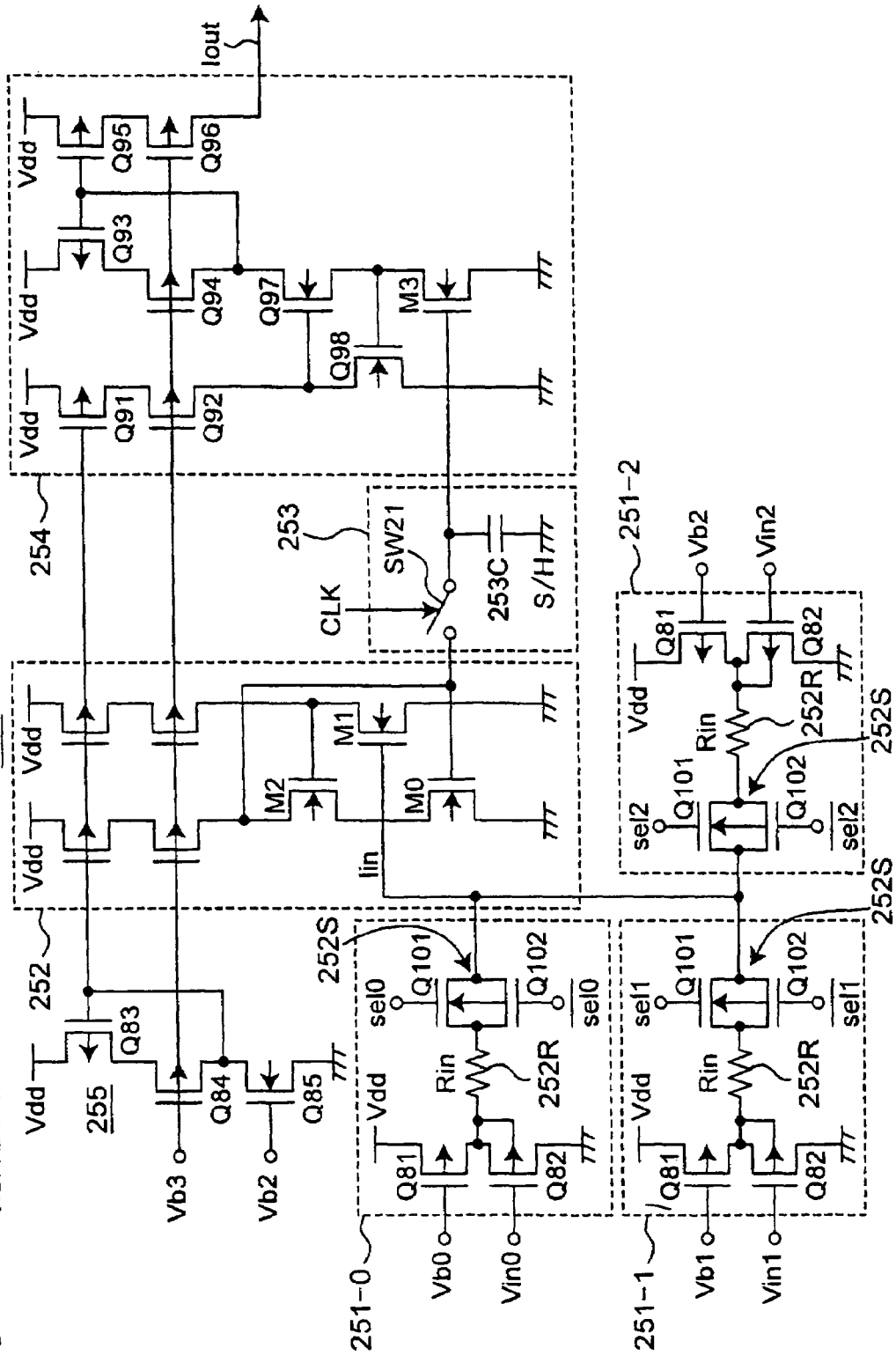
FIG. 32 is a circuit diagram showing a configuration of a signal probing front-end circuit 30B according to a modified preferred example embodiment of the third preferred embodiment.

FIG. 32 is a circuit diagram showing a configuration of a signal probing front-end circuit 30B according to a modified example embodiment of the third embodiment. The modified embodiment of the third example embodiment is characterized, as compared with the third example embodiment, by realizing a multiple-input configuration in which three source follower circuits 251-0 to 251-2, for example, are connected to one current mode sample hold circuit (including the circuits 252, 253 and 254).

Referring to FIG. 32, in each of the source follower circuits 251-0 to 251-2, one end of a resistor 252R having a resistance value Rin is connected an output terminal of a source follower, which consists of two MOSFETs Q81 and Q82. In addition, another end of the resistor 252R is connected to a selector switch 252S which consists of a pair of MESFETs Q101 and Q102 (while the selector switch 252S is controlled by a control signal sel0 and an inverted control signal of the control signal sel0 so that the selector switch 252S of one of the three source follower circuits 251-0 to 251-2 is turned on). All of the selector switches 252S are collectively connected to an input terminal Iin of the voltage-to-current converter 252 of the current mode sample hold circuit. If thus configured, the circuit 30B according to the present modified preferred embodiment has the following features.

(Feature a) The input terminal Iin of the voltage-to-current converter 252, i.e., a voltage of a drain terminal of the MOSFET M0 is kept to almost a certain value by a feedback circuit consisting of MOSFETs M1 and M2. Therefore, the electric potential at the subsequent stage of the selector switch 252S is constant.

(Feature b) On an output side of each source follower, the selector switch 252S and the resistor 252R are connected in series. By appropriately selecting gate sizes of MOSFETs Q101 and Q102, a parasitic resistance value when the selector switch 252S is turned on can be designed smaller by one figure (or one order) or more than the resistor 252R.

Because of these two features a and b, in the signal probing front-end circuit 30B according to the present modified embodiment, even if an input circuit is multiplexed, a signal deterioration caused by the selector switches 252S is small enough and negligible. Furthermore, each of the input circuits, i.e., the source follower circuits 251-0 to 251-2 consists only of the source follower including the two MOSFETs Q81 and Q82, the resistor 252R, and the selector switch 252S. Therefore, the circuit 30B is smaller in area than a plurality of circuits 30A shown in FIG. 31. Accordingly, by applying the circuit configuration according to this modified preferred embodiment to a configuration, which will be described later, in which the same observation target signal wiring is evaluated using a plurality of source follower circuits 270-1 to 270-3 having different central voltages within an allowable input voltage range, then the small-sized circuit can be realized.

Referring to FIG. 32, the current comparator (equivalent to the current comparator 34A shown in FIG. 33) is not shown in the signal probing front-end circuit 30B. In a manner similar to that of the voltage converter 34, the current comparator compares the current generated by the current generator 254 with a reference current Iref converted from each reference voltage Vref, digitizes a comparison result into a binary digital output signal, and outputs the binary digital output signal.

Fourth Preferred Embodiment

If the signal probing front-end circuit 30 shown in FIG. 1 is sufficiently small in area, a plurality of signal probing front-end circuit 30 can be allocated to the observation target signal. In this case, an analog input signal range of an ordinary signal probing front-end circuit 30, where the analog input signal range is capable of obtaining linear input and output characteristics, is often smaller than an amplitude of the observation target signal. Taking this into consideration, each of the signal probing front-end circuits 30 can be designed to change a central voltage of the signal probing front-end circuit 30 so that a sum of allowable input voltage ranges of the respective signal probing front-end circuits 30 sufficiently involve the amplitude and the voltage of the measurement target signal. By thus evaluating the same observation target signal wiring using a plurality of signal probing front-end circuits 30 having different central voltages within the allowable input voltage range, an on-chip signal waveform monitoring apparatus characterized by obtaining a wide input voltage range can be constituted.

The methods for setting the allowable input voltage range and the central voltage of the range of each signal probing front-end circuit 30 are as follows.

(1) A first method of adjusting an analog operation voltage point of the signal probing front-end circuit 30 according to a gate size of a MOSFET.

(2) A second method of adjusting the analog operation voltage point according to a combination of types of transistors used in a manufacturing technique for MOSFETs to be used, that is, a combination of an N channel MOSFET, a P channel MOSFET, an input and output high withstand voltage N channel MOSFET, and an input and output high withstand voltage P channel MOSFET.

(3) A method by a combination of the first method and the second method is also effective.

An implemental example will be described hereinafter.

Figure 33:
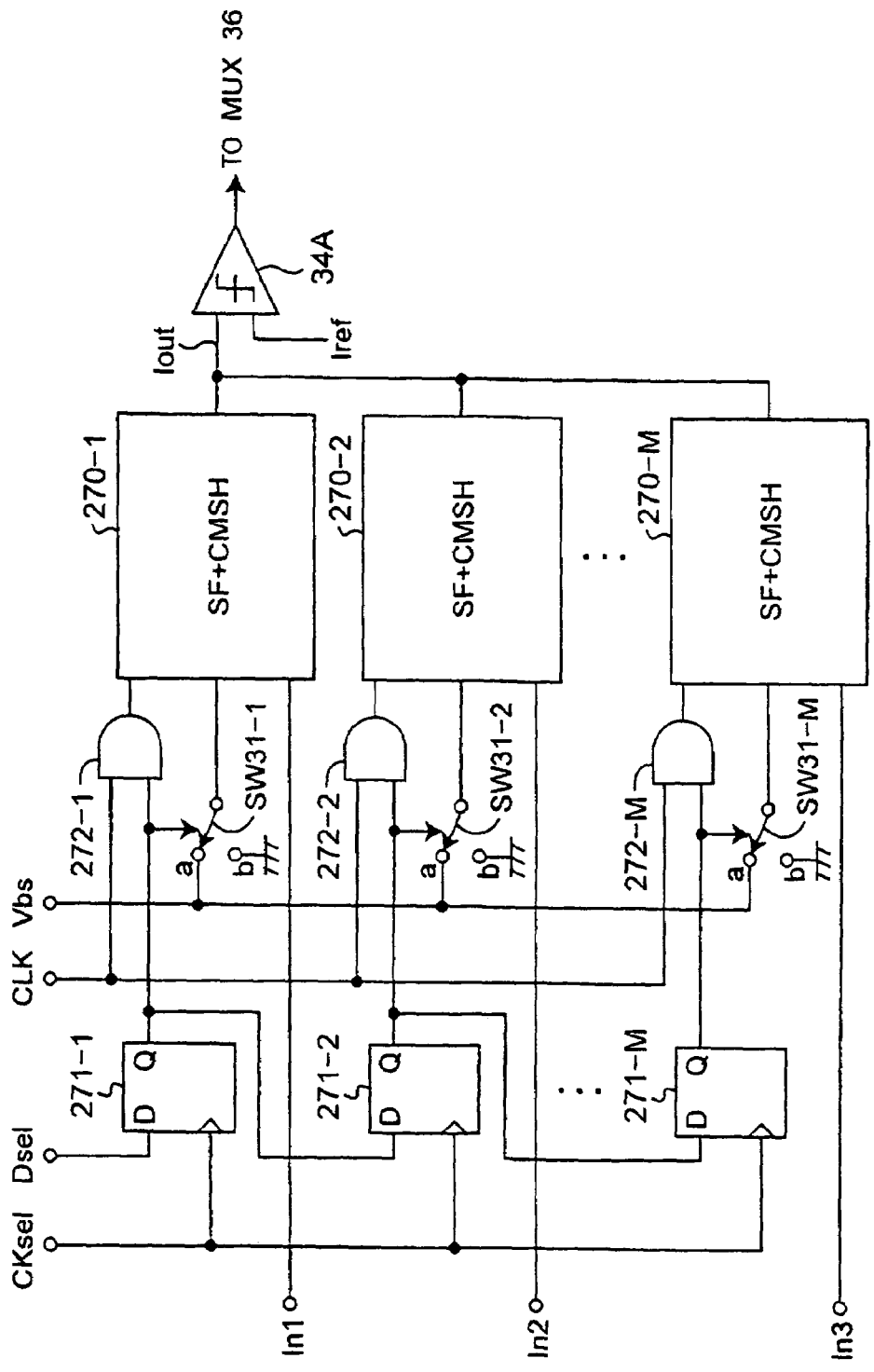
FIG. 33 is a circuit diagram showing a configuration of a signal probing front-end circuit 30C according to a example embodiment.

FIG. 33 is a circuit diagram showing a configuration of a signal probing front-end circuit 30C according to a fourth example embodiment.

Referring to FIG. 33, the signal probing front-end circuit 30C is configured to include M source follower and current mode sample hold circuits 270-1 to 270-M having different input voltage ranges, a selector circuit that allows any one of the M source follower and current mode sample hold circuits 270-1 to 270-M to operate, and a current comparator 34A. The selector circuit includes the following components:

(a) M delay flip-flops 271-1 to 271-M, each temporarily storing a detector selection signal Dsel based on a selection clock CKsel;

(b) M AND gates 272-1 to 272-M that output the output signals from the respective delay flip-flops 271-1 to 271-M only when the clock signal CLK has high level; and (c) switches SW31 to SW31-M that are switched over to the contact "a" only when the output signals from the delay flip-flops 271-1 to 271-M have high level, and supply a current voltage Vbs to the respective source follower and current mode sample hold circuits 270-1 to 270-M.

The output signal from each of the source follower and current mode sample hold circuits 270-1 to 270-M is a current output Iout, and the current output Iout is outputted to the current comparator 34A. The current comparator 34A compares the inputted detected current Iout with a reference current Iref converted from each reference voltage Vref, digitizes a comparison result into a binary digital output signal, and outputs the binary digital output signal to a multiplexer 36.

Figure 34:
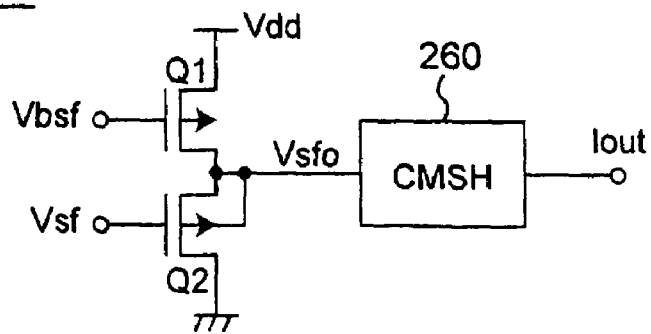
FIG. 34 is a block diagram showing a configuration of a source follower and current mode sample hold circuit 270-1 shown in FIG. 33.
Figure 35:
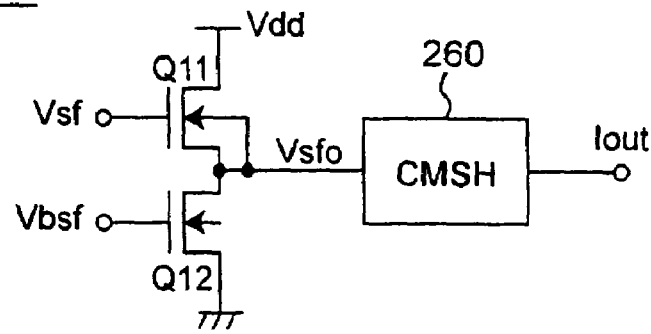
FIG. 35 is a block diagram showing a configuration of a source follower and current mode sample hold circuit 270-2 shown in FIG. 33.
Figure 36:
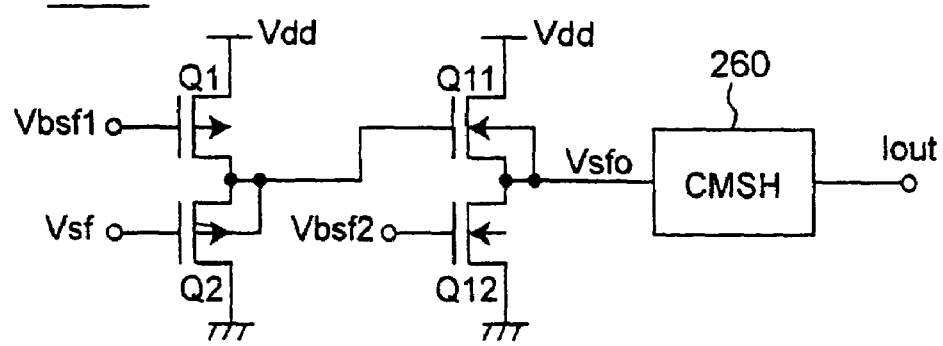
FIG. 36 is a block diagram showing a configuration of a source follower and current mode sample hold circuit 270-3 shown in FIG. 33.
Figure 37:
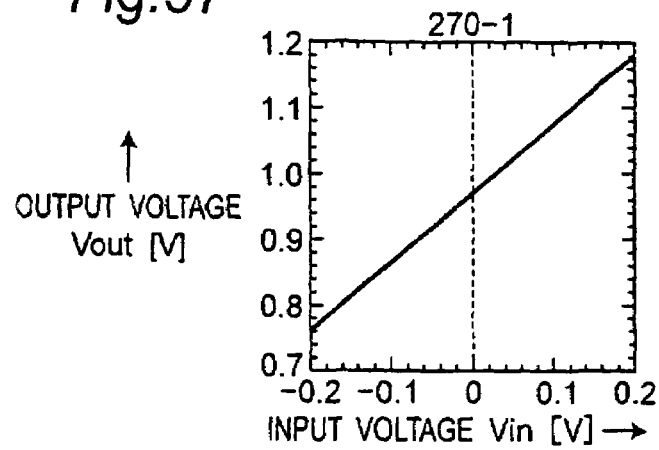
FIG. 37 is a graph showing input and output voltage characteristics of the source follower and current mode sample hold circuit 270-1 shown in FIG. 34.
Figure 38:
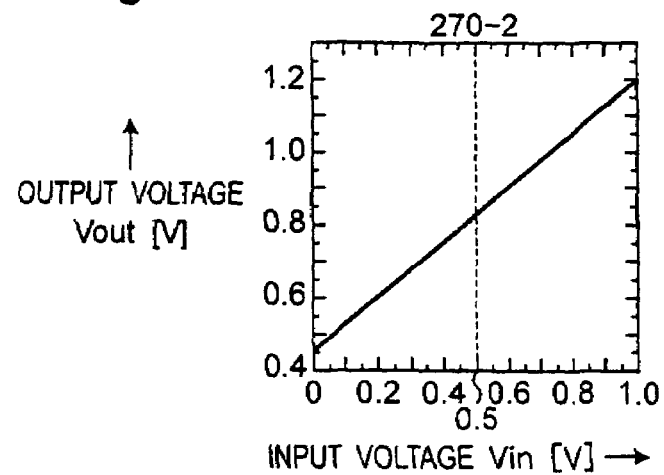
FIG. 38 is a graph showing input and output voltage characteristics of the source follower and current mode sample hold circuit 270-2 shown in FIG. 35.
Figure 39:
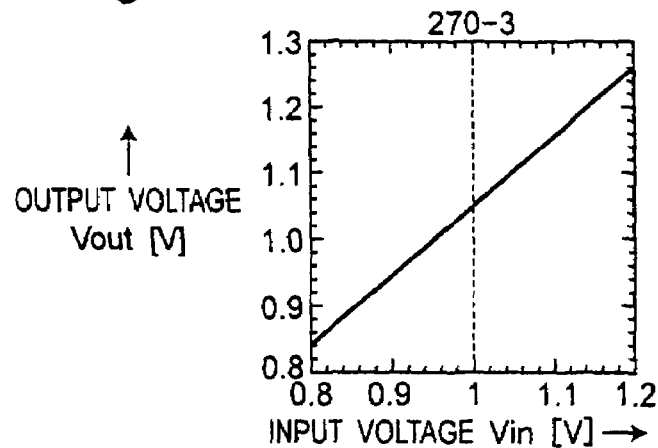
FIG. 39 is a graph showing input and output voltage characteristics of the source follower and current mode sample hold circuit 270-3 shown in FIG. 36.

An implemental example of the source follower and current mode sample hold circuits 270-1 to 270-3 in the case where M is 3 will be described with reference to FIGS. 34 to 39 hereinafter. FIGS. 34 to 36 are block diagrams of configurations of the source follower and current mode sample hold circuits 270-1, 270-2, and 270-3 shown in FIG. 33, respectively. FIGS. 37 to 39 are graphs showing input and output voltage characteristics of the source follower and current mode sample hold circuits 270-1, 270-2, and 270-3 shown in FIGS. 34 to 36, respectively.

The source follower and current mode sample hold circuit 270-1 shown in FIG. 34 is configured to include a source follower circuit consisting of two P channel MOSFETs Q1 and Q2, and a current mode sample hold circuit 260. The source follower and current mode sample hold circuit 270-2 shown in FIG. 35 is configured to include a source follower circuit consisting of two N channel MOSFETs Q11 and Q12, and a current mode sample hold circuit 260. The source follower and current mode sample hold circuit 270-3 shown in FIG. 36 is configured to include a cascade connection circuit, in which a source follower circuit consisting of two P channel MOSFETs Q1 and Q2 and a source follower circuit consisting of two N channel MOSFETs Q11 and Q12 are cascaded to each other, and a current mode sample hold circuit 260. These source follower and current mode sample hold circuits 270-1 to 270-3 can be designed to shift centers of input voltage ranges of the source follower circuits provided on their input stages, e.g., 0.0 V, 0.5 V and 1.0 V as shown in FIGS. 37 to 39, respectively. FIGS. 37 to 39 show input and output voltage characteristics of the respective source follower circuits. In addition, current outputs Iout of the source follower and current mode sample hold circuits 270-1 to 270-3 are read by converting terminal resistance values into voltages, respectively.

Each of the source follower and current mode sample hold circuits 270-1 to 270-M is a current output Iout type circuit. Therefore, to array and mount the M source follower and current mode sample hold circuits 270-1 to 270-M, it suffices to connect the current outputs of the circuits 270-1 to 270-M to a single current read terminal. However, the selector circuit shown in FIG. 33 selects only one of the M source follower and current mode sample hold circuits 270-1 to 270-M that operates at the same time. For this purpose, the selector circuit that selectively turns on one of the M source follower and current mode sample hold circuits 270-1 to 270-M is provided.

Since the number of transistors is small in each of the source follower and current mode sample hold circuits 270-1 to 270-M, the signal probing front-end circuit 30C can be made small in size. The occupation area per signal probing front-end circuit 30C is about 30 µm×120 µm if the circuit 30C is designed by, for example, the 0.25-µm CMOS technique.

Figure 40:
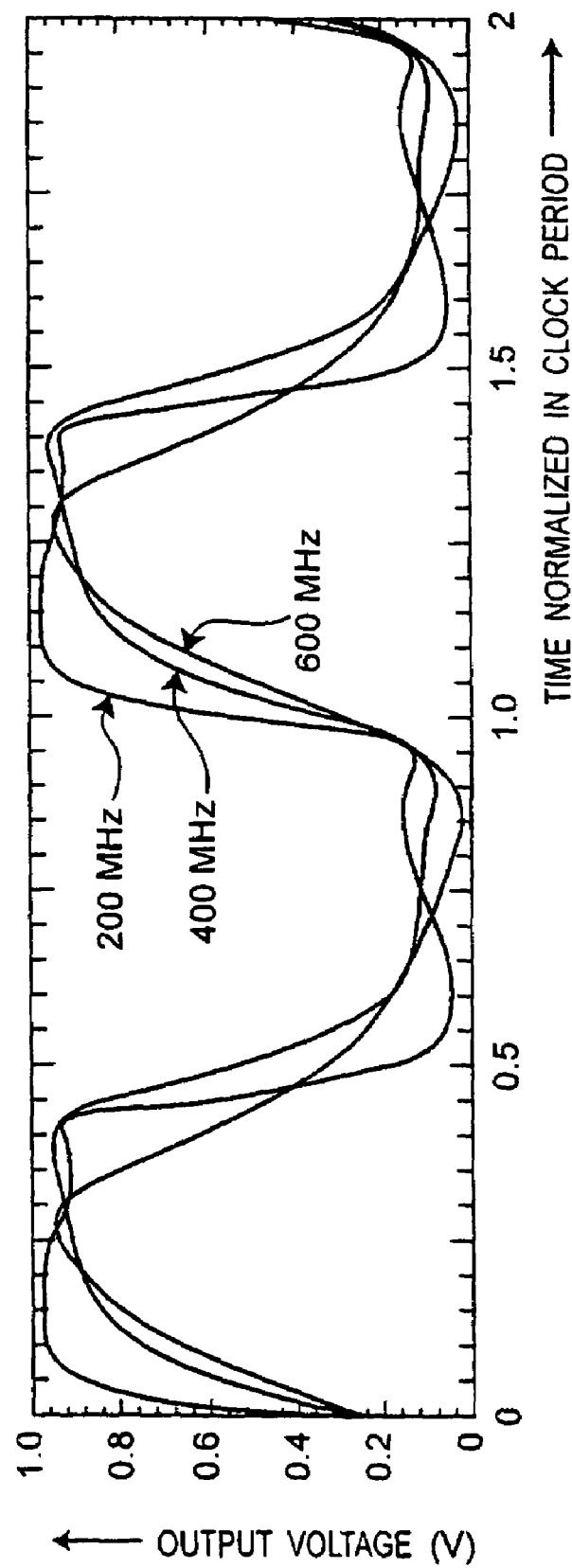
FIG. 40 is a waveform chart showing on-chip signal waveforms measured by the signal probing front-end circuit 30C according to the fourth example embodiment.

As described so far, these features enable the configuration in which the same measurement target signal is observed using a plurality of source follower and current mode sample hold circuits 270-1 to 270-M having different center voltages within the input voltage range. This configuration can realize a total input voltage range from, for example, −0.2 V to 1.2 V. As shown in FIG. 40, a full-swing waveform observation of an on-chip signal on a CMOS digital circuit can be realized. FIG. 40 is a waveform chart showing on-chip signal waveforms measured by the signal probing front-end circuit 30C according to the fourth preferred embodiment of the present invention. The measurement target signal is an internal clock signal when the CMOS digital circuit having a power source voltage of one volt operates at operation frequencies of 200 MHz, 400 MHz, and 600 MHz, respectively. The horizontal axis is normalized by a clock cycle. In addition, an area of the entire signal probing front-end circuits 30C is as sufficiently small as 120 µm×100 µm.

As described so far in detail, each of the signal waveform measurement apparatus and the signal waveform measurement system according to the present invention is configured so that each signal probing front-end circuit is mounted to correspond to each detection point, the judgment output probability for the detected voltage at each detection point is calculated and outputted based on the binary digital output signal from each signal probing front-end circuit, and further, the detected voltage is decided based on the judgment output probability. Therefore, it is possible to acquire waveforms at multiple observation points such as those of internal signals of the functional circuits that constitute the system LSI, and noises of the power source voltage, the ground voltage, the well voltage, and the substrate voltage on the LSI chip at higher speed with higher correction than those of the prior art. In addition, a test cost of the system LSI required by the multi-channel on-chip waveform acquisition can be reduced, and design reliability can be improved.

Moreover, the sampling timing signal generator according to the present invention is so configured that the predetermined reference bias voltage is generated in synchronization with the system clock signal based on the system clock signal, that the reference bias voltage is outputted, a current obtained by dividing a reference current corresponding to the reference bias voltage by the number "n" (where "n" is a number equal to or larger than one) is generated based on the master clock signal and the reference bias signal, that a predetermined delay time is generated by multiplying a time for electrically charging an output load capacitance by the number "n" based on the generated current, that an enable timing control signal obtained by multiplexing the plurality of enable timing signals is generated by delaying the master clock signal by the delay time, and that the reference bias voltage is generated so that the delay time is equal to a cycle of the system clock signal. By this the enable timing signals are generated. Therefore, it is possible to provide the sampling timing signal generator for the signal waveform measurement system, where the sampling timing signal generator becomes smaller in operation noises than the prior art and better suited for the on-chip signal waveform measurement apparatus.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An on-chip signal waveform measurement apparatus mounted on an IC chip, said on-chip signal waveform measurement apparatus measuring signal waveforms at a plurality of detection points on the IC chip, said on-chip signal waveform measurement apparatus comprising:
 a reference voltage generator for successively generating and outputting a plurality of reference voltages different from each other based on a predetermined timing signal;
 a plurality of signal probing front-end circuits mounted so as to correspond to the detection points, respectively, each of said signal probing front-end circuits buffer-amplifying a voltage at each of the detection points, comparing the buffer-amplified voltage with each of the reference voltages, digitizing a comparison result into a binary digital output signal, and outputting the binary digital output signal;
 a multiplexer for time-division-multiplexing the binary digital output signals from said signal probing front-end circuits, and outputting a multiplexed digital output signal; and
 a data processing unit for calculating and outputting a judgment output probability for a detected voltage at each of the detection points detected by each of said signal probing front-end circuits, by counting a number of times of a predetermined binary value of the multiplexed binary digital output signal outputted from said multiplexer.

2. The on-chip signal waveform measurement apparatus as claimed in claim 1, further comprising:
 a sampling timing signal generator for generating an enable timing control signal obtained by multiplexing a plurality of enable timing signals based on a predetermined system clock signal and a predetermined master clock signal; and
 a demultiplexer for demultiplexing the enable timing control signal to generate and output enable timing signals for allowing said respective signal probing front-end circuits to sequentially operate,
 wherein said sampling timing signal generator comprises:
 a replica DLL (Delayed Locked Loop) circuit for generating and outputting a predetermined reference bias voltage based on the system lock signal in synchronization with the system clock signal; and
 a delay signal generator circuit for generating a current obtained by dividing a reference current corresponding to the reference bias voltage by a number "n" (where "n" is a number equal to or larger than one) based on the master clock signal and the reference bias voltage, for generating a predetermined delay time by multiplying a time for electrically charging an output load capacitance by a number "n" based on the generated current, and for delaying the master clock signal by the delay time, to generate the enable timing control signal obtained by multiplexing the plurality of enable timing signals, and
 wherein said replica DLL circuit generates the reference bias voltage so that the delay time is equal to a cycle of the system clock signal, whereby said delay signal generator circuit generates the enable timing control signal obtained by multiplexing the plurality of enable timing signals.

3. The on-chip signal waveform measurement apparatus as claimed in claim 2,
 wherein each of said signal probing front-end circuits comprises:
 a source follower circuit for buffer-amplifying the voltage at each of the detection points based on each of the enable timing signals; and
 a comparator for comparing the buffer-amplified voltage with each of the reference voltages, digitizing the comparison result into the binary digital output signal, and outputting the binary digital output signal.

4. The on-chip signal waveform measurement apparatus as claimed in claim 3,
 wherein the source follower circuit of each of the signal probing front-end circuit includes a plurality of source followers having input voltage ranges different from each other, respectively,
 wherein each of said signal probing front-end circuits includes a selector circuit for sequentially selecting the plurality of source followers, and
 wherein each of the signal probing front-end circuits has an input voltage range wider than the input voltage range of each of the plurality of source followers.

5. The on-chip signal waveform measurement apparatus as claimed in claim 2,
 wherein each of said signal probing front-end circuits comprises:
 a source follower circuit for buffer-amplifying the voltage at each of the detection points based on each of the enable timing signals;
 a voltage-to-current converter for converting the buffer-amplified voltage into a current;
 a sample hold circuit for sample-holding the converted current; and
 a comparator for comparing a sample-held current with the reference current converted from each of the reference voltages, digitizing the comparison result into the binary digital output signal, and outputting the binary digital output signal.

6. The on-chip signal waveform measurement apparatus as claimed in claim 5,
 wherein the source follower circuit of each of the signal probing front-end circuits includes a plurality of source followers having input voltage ranges different from each other, respectively,
 wherein each of said signal probing front-end circuits includes a selector circuit for sequentially selecting the plurality of source followers, and
 wherein each of the signal probing front-end circuits has an input voltage range wider than the input voltage range of each of the plurality of source followers.

7. The on-chip signal waveform measurement apparatus as claimed in claim 2,
 wherein said data processing unit comprises:
 a counter circuit for counting the number of times of the predetermined binary value of the multiplexed binary digital output signal outputted from said multiplexer; and
 a shift register circuit for calculating the judgment output probability for the detected voltage at each of the detection points detected by each of said signal probing front-end circuits based on the number of times of the predetermined binary value of the binary digital output signal counted by said counter circuit, and for outputting serial data on the judgment output probability.

8. The on-chip signal waveform measurement apparatus as claimed in claim 7,
 wherein said data processing unit outputs serial data on a constant judgment output probability when the detected voltage and the reference voltage are both constants.

9. The on-chip signal waveform measurement apparatus as claimed in claim 1,
wherein each of said signal probing front-end circuit comprises:
a source follower circuit for buffer-amplifying the voltage at each of the detection points based on enable timing signals; and
a comparator for comparing the buffer-amplified voltage with each of the reference voltages, digitizing the comparison result into the binary digital output signal, and outputting the binary digital output signal.

10. The on-chip signal waveform measurement apparatus as claimed in claim 9,
wherein the source follower circuit of each of the signal probing front-end circuits includes a plurality of source followers having input voltage ranges different from each other, respectively,
wherein each of said signal probing front-end circuits includes a selector circuit for sequentially selecting the plurality of source followers, and
wherein each of the signal probing front-end circuits has an input voltage range wider than the input voltage range of each of the plurality of source followers.

11. The on-chip signal waveform measurement apparatus as claimed in claim 1,
wherein each of said signal probing front-end circuits comprises:
a source follower circuit for buffer-amplifying the voltage at each of the detection points based on enable timing signals;
a voltage-to-current converter for converting the buffer-amplified voltage into a current;
a sample hold circuit for sample-holding the converted current; and
a comparator for comparing a sample-held current with the reference current converted from each of the reference voltages, digitizing the comparison result into the binary digital output signal, and outputting the binary digital output signal.

12. The on-chip signal waveform measurement apparatus as claimed in claim 11,
wherein the source follower circuit of each of the signal probing front-end circuits includes a plurality of source followers having input voltage ranges different from each other, respectively,
wherein each of said signal probing front-end circuits includes a selector circuit for sequentially selecting the plurality of source followers, and
wherein each of the signal probing front-end circuits has an input voltage range wider than the input voltage range of each of the plurality of source followers.

13. The on-chip signal waveform measurement apparatus as claimed in claim 1,
wherein said data processing unit comprises:
a counter circuit for counting the number of times of the predetermined binary value of the multiplexed binary digital output signal outputted from said multiplexer; and
a shift register circuit for calculating the judgment output probability for the detected voltage at each of the detection points detected by each of said signal probing front-end circuits based on the number of times of the predetermined binary value of the binary digital output signal counted by said counter circuit, and for outputting serial data on the judgment output probability.

14. The on-chip signal waveform measurement apparatus as claimed in claim 13,
wherein said data processing unit outputs serial data on a constant judgment output probability when the detected voltage and the reference voltage are both constants.

15. A signal waveform measurement system comprising an on-chip signal waveform measurement apparatus,
wherein said on-chip signal waveform measurement apparatus is mounted on an IC chip, and is provided for measuring signal waveforms at a plurality of detection points on the IC chip,
wherein said on-chip signal waveform measurement apparatus comprises:
a reference voltage generator for successively generating and outputting a plurality of reference voltages different from each other based on a predetermined timing signal;
a plurality of signal probing front-end circuits mounted so as to correspond to the detection points, respectively, each of said signal probing front-end circuits buffer-amplifying a voltage at each of the detection points, comparing the buffer-amplified voltage with each of the reference voltages, digitizing a comparison result into a binary digital output signal, and outputting the binary digital output signal;
a multiplexer for time-division-multiplexing the binary digital output signals from said signal probing front-end circuits, and outputting a multiplexed digital output signal; and
a data processing unit for calculating and outputting a judgment output probability for a detected voltage at each of the detection points detected by each of said signal probing front-end circuits, by counting a number of times of a predetermined binary value of the multiplexed binary digital output signal outputted from said multiplexer,
wherein said signal waveform measurement system further comprises a further data processing unit provided in an external apparatus other than said IC chip, said further data processing unit deciding the detected voltage at each of the detection points using such a feature that a reference voltage, at which a gradient of a characteristic of the judgment output probability obtained as the comparison result of comparing each of the detected voltages with each of the reference voltages is substantially the maximum, is the detected voltage, based on the judgment output probability for the detected voltage at each of the detection points from said data processing unit.

16. The signal waveform measurement system as claimed in claim 15,
wherein the on-chip signal waveform measurement apparatus further comprises:
a sampling timing signal generator for generating an enable timing control signal obtained by multiplexing a plurality of enable timing signals based on a predetermined system clock signal and a predetermined master clock signal; and
a demultiplexer for demultiplexing the enable timing control signal to generate and output enable timing signals for allowing said respective signal probing front-end circuits to sequentially operate,
wherein said sampling timing signal generator comprises:
a replica DLL (Delayed Locked Loop) circuit for generating and outputting a predetermined reference bias voltage based on the system clock signal in synchronization with the system clock signal; and
a delay signal generator circuit for generating a current obtained by dividing a reference current corresponding to the reference bias voltage by a number "n" (where "n" is a number equal to or larger than one) based on the master clock signal and the reference bias voltage, for generating a predetermined delay time by multiplying a time for electrically charging an output load capacitance by a number "n" based on the generated current, and for delaying the master clock signal by the delay time, to generate the enable timing control signal obtained by multiplexing the plurality of enable timing signals, and wherein said replica DLL circuit generates the reference bias voltage so that the delay time is equal to a cycle of the system clock signal, whereby said delay signal generator circuit generates the enable timing control signal obtained by multiplexing the plurality of enable timing signals.

17. The signal waveform measurement system as claimed in claim 15, wherein said further data processing unit sequentially stores the data on the judgment output probability from said data processing unit in a storage device, compares the data on the judgment output probability from said data processing unit with up-to-date data on the judgment output probability latest stored in said storage device, and stores the data on the judgment output probability from said data processing unit only when the data is different from the up-to-date data, thereby storing only the data on the judgment output probability only in a transition region near a region, in which the gradient of the characteristic of the judgment output probability obtained as the comparison result of comparing each of the detected voltages with each of the reference voltages is substantially the maximum in said storage device.

18. The signal waveform measurement system as claimed in claim 16, wherein said further data processing unit sequentially stores the data on the judgment output probability from said data processing unit in a storage device, compares the data on the judgment output probability from said data processing unit with up-to-date data on the judgment output probability latest stored in said storage device, and stores the data on the judgment output probability from said data processing unit only when the data is different from the up-to-date data, thereby storing only the data on the judgment output probability only in a transition region near a region, in which the gradient of the characteristic of the judgment output probability obtained as the comparison result of comparing each of the detected voltages with each of the reference voltages is substantially the maximum in said storage device.

* * * * *